United States Patent [19]

Fukaya et al.

[11] Patent Number: 4,746,535
[45] Date of Patent: May 24, 1988

[54] METHOD OF MAKING PHOTOSENSORS

[75] Inventors: Masaki Fukaya, Yokohama; Toshiyuki Komatsu, Yamato; Tatsumi Shoji, Hiratsuka; Masaru Kamio, Atsugi; Nobuyuki Sekimura, Kawasaki, all of Japan

[73] Assignee: Canon Kabushiki Kaisha, Japan

[21] Appl. No.: 101,949

[22] Filed: Sep. 25, 1987

Related U.S. Application Data

[62] Division of Ser. No. 781,733, Sep. 30, 1985, Pat. No. 4,724,323.

[30] Foreign Application Priority Data

| Oct. 4, 1984 | [JP] | Japan | 59-207091 |
| Oct. 5, 1984 | [JP] | Japan | 59-208363 |
| Oct. 8, 1984 | [JP] | Japan | 59-209661 |
| Oct. 9, 1984 | [JP] | Japan | 59-210493 |
| Oct. 11, 1984 | [JP] | Japan | 59-211464 |

[51] Int. Cl.$^4$ .............................. B05D 3/06
[52] U.S. Cl. ............................ 427/39; 427/74
[58] Field of Search .......................... 427/39, 74

[56] References Cited

U.S. PATENT DOCUMENTS 4,345,021 8/1982 Ogawa et al. .
4,390,791 6/1983 Hatanaka et al. .
4,581,099 4/1986 Fukaya et al. .

FOREIGN PATENT DOCUMENTS 053946 6/1982 European Pat. Off. .
2102028 1/1983 United Kingdom .
2163289 2/1986 United Kingdom .

OTHER PUBLICATIONS

K. Komiya, et al., International Electron Devices Meeting, Washington, D.C. 7th-9th Dec. 1981, pp. 309-312, IEEE, New York, U.S.; "A 2048-Element Contact Type Linear Image Sensor for Facsimile".

Primary Examiner—Bernard D. Pianalto
Attorney, Agent, or Firm—Fitzpatrick, Cella, Harper & Scinto

[57] ABSTRACT

A photosensor comprising a photoconductive layer provided on a substrate. The layer contains amorphous silicon. At least a portion of the layer has a refractive index varying continuously through the thickness of the layer. The refractive index of the layer is 3.2 or less at a wavelength of 6,328 Å in the vicinity of the surface of the substrate. A pair of electrodes are provided in electrical contact with the photoconductive layer. A photoreceptor is also provided, part of which is constituted by the spacing between the electrodes of the pair.

1 Claim, 16 Drawing Sheets

METHOD OF MAKING PHOTOSENSORS

This is a division of application Ser. No. 781,733, filed Sept. 30, 1985, now U.S. Pat. No. 4,724,323.

BACKGROUND OF THE INVENTION

1. Field of the Invention

The present invention relates to an image line sensor unit, photosensors for use in the line sensors and methods of making the photosensors.

2. Description of the Prior Art

In conventional photoelectric conversion apparatus used as optical input units of image data processing apparatus such as facsimile devices, reproduction devices, or character readers, it is well known to use photosensors as photoelectric conversion elements. Recently, high sensitivity image readers are composed of line sensors each including a one-dimensional array of photosensors. One example of such a line sensor is a planar photoelectric photosensor having a pair of opposing electrodes made of metal or the like disposed so as to form a spacing which forms a photoreceptor on a photoelectric layer which contains amorphous silicon (referred to as a-Si hereinafter, and, among others, amorphous silicon which especially contains atoms such as hydrogen or halogens, e.g., flourine, is referred to as a-Si(H,X) hereinafter).

Methods of preparing a-Si(H,X) which is used for making such a photosensor are known, examples being plasma CVD, reactive sputtering, or ion plating. All of these methods use glow discharge to expedite reaction. In any of these methods, however, it is necessary to form an a-Si(H,X) film with relatively low discharge power in order that the film has high quality and high photoconductivity. Photoconductive layers resulting from formation of films with such low discharge power, however, have insufficient adhesion to their substrates made of glass or ceramics and the films are likely to peel off when the photoconductive layers are subjected to a subsequent photolithography process for forming the electrodes.

In order to prevent this peeling-off of films, a method of roughening a surface of the substrate and depositing a-Si(H,X) on the resulting surface has been employed. That is, the substrate surface is previously etched chemically for example with hydrofluoric acid, or scratched physically, for example, with a brush.

However, this method has the following drawbacks:

(1) The system associated with the washing line has a complicated structure and is expensive when a chemical such as hydrofluoric acid is used;

(2) It is difficult to control the degree of the ruggedness of the substrate surface; and (3) Microscopic defects are likely to occur at the substrate surface when same is roughened. The characteristics of an a-Si(H,X) film deposited on the microscopic defects and hence the characteristics of the resulting photoconductive layer are likely to vary from place to place.

Therefore, when an image line sensor unit is formed by photosensor units such as mentioned above, a correction circuit which eliminates a large discrepancy between respective bit signals must be additionally provided, thereby increasing cost.

SUMMARY OF THE INVENTION

It is an object of the present invention to provide an image line sensor unit which eliminates the above prior art drawbacks.

It is another object of the present invention to provide an inexpensive image line sensor which improves the uniformity of the characteristics of photosensors thereof, thereby decreasing a discrepancy between bit signals and requiring no correct circuit.

Still another object of the present invention is to provide an image line sensor unit which improves the uniformity of the characteristics of respective photosensors of a photosensor array thereof, thereby driving a matrix of an image reader easily and properly.

A further object of the present invention is to provide an image reader which brings about an improved uniformity of the characteristics of respective photosensors of a photosensor array thereof and performs high-speed reading.

A still further object of the present invention is to provide an inexpensive color photosensor which maintains a good performance for a long time and has a reduced discrepancy between the characteristics of the photosensor units thereof.

Another object of the present invention is to provide a good uniform photosensor which can be formed at low cost and has a photoconductive layer film which is unlikely to be peeled off.

A further object of the present invention is to form photosensors having high uniformity at low cost.

According to one aspect of the present invention is provided an image line sensor which comprises:

an array of photosensors, each including:

a photoconductive layer including amorphous silicon provided on a substrate, at least a portion of said layer having a refractive index varying continuously through the thickness thereof, the refractive index of the layer being 3.2 or less at a wavelength of 6,328 Å near a surface of said substrate;

a pair of electrodes provided in electrical contact with said photoconductive layer; and a photoreceptor; and a light source for illuminating an original document.

According to another aspect of the present invention is provided a photosensor which comprises:

a photoconductive layer provided on a substrate, said layer including amorphous silicon, at least a portion of said layer having a refractive index varying continuously through the thickness thereof, the refractive index of the layer being 3.2 or less at a wavelength of 6,328 Å near a surface of said substrate;

a pair of electrodes provided in electrical contact with said photoconductive layer; and a photoreceptor.

Another object of the present invention is to provide a method of forming a photosensor by depositing a photoconductive layer under a plasma of glow discharge, this object is attained by providing, according to the invention, a method comprising the steps of first performing deposition with relatively large discharge power, and then continuing the deposition while decreasing the discharge power slowly, thereby forming the photoconductive layer, the refractive index of at least a portion of which varies continuously through the thickness of the layer.

BRIEF DESCRIPTION OF THE DRAWINGS

FIG. 15 is a cross-sectional view taken along line XIII—XIII of FIG. 14;

DETAILED DESCRIPTION OF THE PREFERRED EMBODIMENTS

Now embodiments of the present invention will be described.

In this specification, one of the photoconductive layers which are included in a photosensor and which is adjacent to the surface of the substrate may be referred to as underlying a-Si(H,X) layer(s), and one or more layers overlying the underlying layer may be referred to as overlying a-Si(H,X) layer(s). The photoconductive layer with the present invention should preferably have a portion formed between the underlying a-Si(H,X) layer and the a-Si(H,X) layer immediately overlying this underlying layer, the portion having a refractive index varying continuously through its thickness. The overlying layers should preferably include a high photoconductivity layer.

Figure 2:
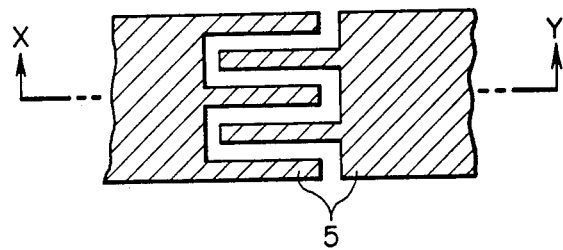
FIG. 2 is a plan view of a portion of a photosensor according to the present invention.
Figure 3:
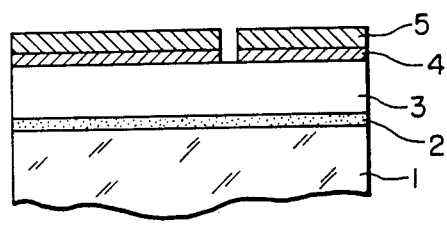
FIG. 3 is a cross-sectional view taken along line X-Y of FIG. 2.

FIG. 2 is a plan view of a portion of a photosensor in an embodiment of an image line sensor unit according to the present invention. FIG. 3 is a cross-sectional view taken along line X-Y of FIG. 2. In FIG. 3, reference numeral 3 denotes the substrate; reference numeral 2 denotes the underlying a-Si(H,X) layer; reference numeral 3 denotes an overlying a-Si(H,X) layer(s). These elements constitute the photoconductive layer. Reference numeral 4 denotes an ohmic contact n+ layer composed of a-Si(H,X). Reference numeral 5 denotes electroconductive layers which form electrodes.

In FIG. 3, the boundary between underlying and overlying a-Si(H,X) layers 2 and 3 is clearly shown. However, in fact, this boundary is formed as a layer, the refractive index of which varies continuously and which shows an intermediate quality between those of layers 2 and 3.

Corning "#7059" and "#7740", Tokyo Oka, "SCG", glass such as silicon glass, or ceramics such as partially glazed ceramics or the like may be used as a preferred substrate material for the photosensor.

In the photosensor according to the present invention, at least a portion of the photoconductive layers which are included in the photosensor has a refractive index which varies continuously through its thickness. In addition, the refractive index of a portion of the conductive layer near the surface of the substrate is 3.2 or less at a wavelength of 6,328 Å. Such a photoconductive layer can be formed by appropriately setting the conditions of formation thereof in performing glow discharge using plasma CVD, reactive sputtering, or ion plating.

The photoconductive layer includes an amorphous material which includes a-Si(H,X) as a main component. The refractive index of underlying a-Si(H,X) layer 2 is 3.2 or less. The refractive index of overlying a-Si(H,X) layer 3 is larger than 3.2, preferably about 3.4. The photoconductive layer will be formed using plasma CVD, reactive sputtering, or ion plating, especially plasma CVD. In the photoconductive layers thus formed, a stress is produced due to hydrogen and/or halogen atoms taken in when the layers are formed. If this stress is too large, the adhesion of the photoconductive layer to the substrate is deteriorated and the layer or film is likely to be peeled off. The magnitude of the stress in the photoconductive layer can be controlled by setting the layer formation conditions such as, for example, the discharge power of glow discharge, the substrate temperature, the composition and pressure of a source gas used, to respective appropriate values. A small-stressed layer can be formed as the underlying a-Si(H,X) layer 2 adjacent to substrate 1 by performing glow discharge having relatively large power, thereby keeping good adhesion to substrate 1.

On the other hand, it is known that stress in the photoconductive layer is correlated greatly with the refractive index of the layer. It is also known that, generally, when the stress is small, refractive index is also small. It is also known that execution of glow discharge with relatively low discharge power is required in order that the photoconductive layer has an excellent photoconductivity.

Thus, preferably, glow discharge is first performed with relatively high power over substrate 1, thereby to form the underlying a-Si(H,X) layer 2 having a relatively small refractive index, for example, of 3.2 or less, discharge power is then decreased slowly to a relatively small value while deposition is being continued, thereby forming a part which has a refractive index varying continuously through its thickness, and glow discharge is further performed with the relatively small power to form a high photoconductivity a-Si(H,X) layer 3 having a relatively large refractive index, for example, of about 3.4.

The conductive layers 5 which will be electrodes may include an electrically conductive film, for example, of aluminum or the like.

Figure 20:
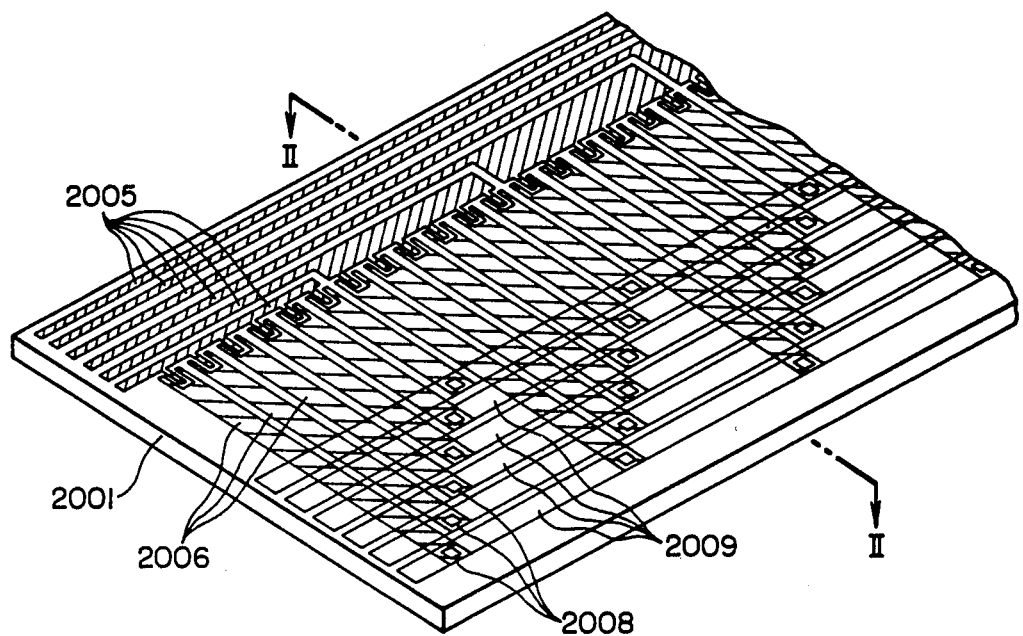
FIG. 20 is a perspective view of a part of another photosensor array of a device according to the present invention.
Figure 21:
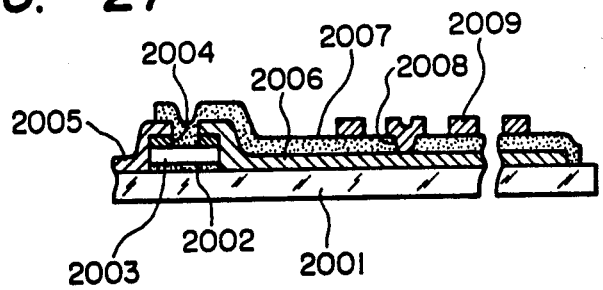
FIG. 21 is a cross-sectional view taken along line II—II of FIG. 20.

FIG. 20 is a perspective view of a part of a photosensor array in a preferred embodiment of an image reader according to the present invention. FIG. 21 is a cross-sectional view taken along line II—II of FIG. 20. In these figures, reference 2001 denotes substrate; reference numeral 2002 denotes underlying a-Si(H,X) layer; reference numeral 2003 denotes overlying a-Si(H,X) layer. These components constitute the photoconductive layer. Reference numeral 2004 denotes an ohmic contact n+ layer of a-Si(H,X) layer; reference numeral 2005 denotes common block electrodes; reference numeral 2006 denotes individual electrodes; reference numeral 2007 denotes an insulating layer; reference numeral 2008 denotes through holes; reference numeral 2009 denotes upper electrodes. Insulating layer 2007 includes an insulating inorganic film of SiN:N or the like or any of various insulating organic resin films. Upper electrodes 2009 as well as common electrodes 2005 and individual electrodes 2006 each include an electrically conductive film of aluminum or the like. The other structure is the same as that of each of the photosensors of FIGS. 2 and 3.

Figure 26:
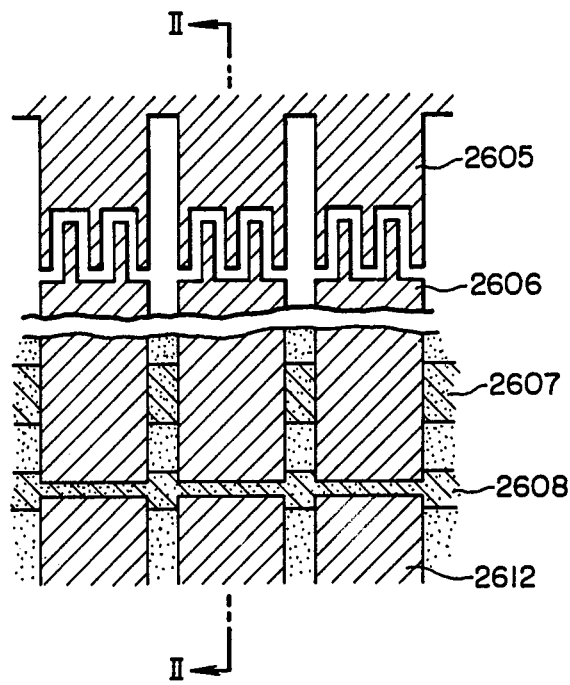
FIG. 26 is a plan view of a part of still another photosensor array of a device according to the present invention.
Figure 27:
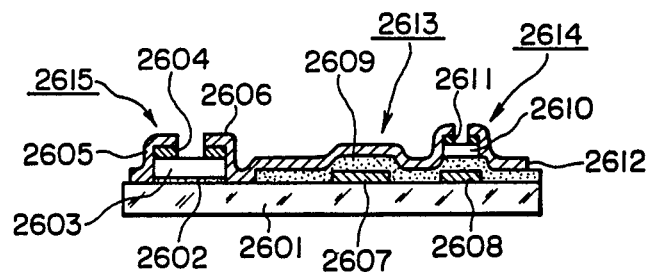
FIG. 27 is a cross-sectional view taken along line II—II of FIG. 26.
Figure 28:
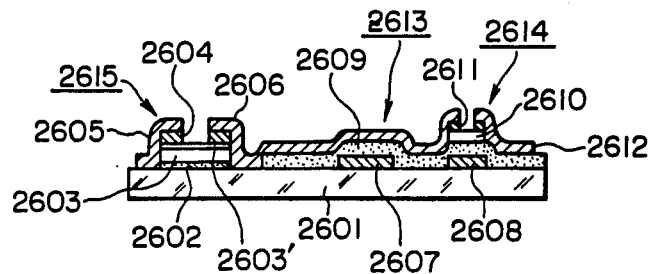
FIG. 28 is a cross-sectional view of a further photosensor array according to the present invention.

FIG. 26 is a plan view of part of a photosensor array in another preferred embodiment of the image reader according to the present invention. FIG. 27 is a cross-sectional view taken along line II—II of FIG. 26. In these figures, reference numeral 2601 denotes substrate; reference numeral 2602 denotes underlying a-Si(H,X) layer; reference numeral 2603 denotes overlying a-Si(H,X) layer. These components constitute the photoconductive layer. Reference numeral 2604 denotes an ohmic contact n+ layer of a-Si(H,X); reference numeral 2605 denotes common electrodes; reference numeral 2606 denotes individual electrodes; reference numeral 2607 and 2608 denote electrically conductive layers; reference numeral 2609 denotes insulating layer; reference numeral 2610 denote semiconductor layers; reference numeral 2611 denotes an ohmic contact n+ layer of a-Si(H,X); reference numeral 2612 denote wires which take out signals. Thus capacitors 2613 for storing electric charge and switching transistors 2614 for taking out the electric charge stored in the capacitors are formed. Reference numeral 2615 denotes a photoconductive conversion section.

Conductive layers 2607 and 2608 may include electrically conductive layers, for example, of Cr or the like. Insulating layer 2609 is made of an insulating inorganic film of SiN:H or the like, or any of various insulating organic resin films. Signal taking-out wires each include an electrically conductive film, for example, of aluminum or the like. The other structure is the same as that of each of the photosensors of FIGS. 2 and 3.

Figure 29:
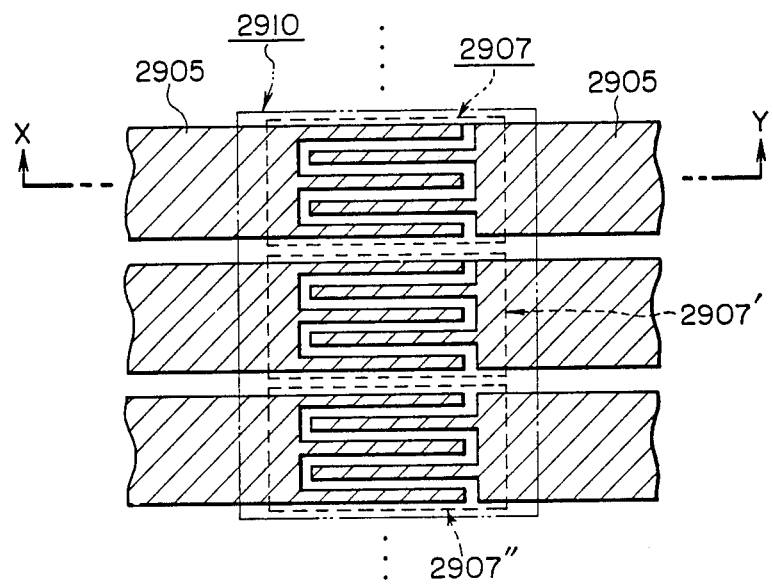
FIG. 29 is a plan view of a color photosensor according to the present invention.
Figure 30:
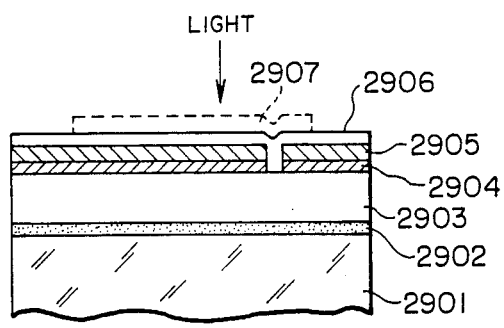
FIG. 30 is a cross-sectional view taken along line X-Y of FIG. 29.

FIG. 29 is a plan view of part of an embodiment of an array of color photosensors each constructed according to the present invention. FIG. 30 is a cross-sectional view taken along line X-Y of FIG. 29. In these figures, reference numeral 2901 denotes substrate; 2902 denotes underlying a-Si(H,X) layer; reference numeral 2903 denotes overlying a-Si(H,X) layer. These elements constitute the photoelectric layer. Reference numeral 2904 denotes an ohmic contact n+ layer of a-Si(H,X); reference numeral 2905 denotes electrically conductive layers or electrodes; reference numeral 2906 denotes a protective layer; and reference numeral 2907 denotes a color filter.

Electrodes 2905 each include a conductive layer, for example, of aluminum or the like.

Protective layer 2906 includes an insulating inorganic film of SiN:H or the like or any of various insulating organic resin films.

Color filter 2907 is formed into a film by vapor depositing colorants or coloring matter such as pigments both thermally stable and sublimable. The colorants for forming such a color filter may include various colorants such as acetoaceticanilide colorants, monoazo colorants of naphthols, polycyclic colorants, disperse colorants, oil-soluble colorants, indanthrene colorants, phthalocyanine colorants. Particularly preferable colorants are phthalocyanine colorants, perylene colorants, isoindolinone colorants, anthraquinone colorants and quinacridone colorants, and typical examples thereof are shown below Examples of phthalocyanine colorants may include metal-free phthalocyanine, copper phthalocyanine, beryllium phthalocyanine, magnesium phthalocyanine, zinc phthalocyanine, titanium phthalocyanine, tin phthalocyanine, lead phthalocyanine, vanadium phthalocyanine, chromium phthalocyanine, molybdenum phthalocyanine, manganese phthalocyanine, iron phthalocyanine, cobalt phthalocyanine, nickel phthalocyanine, palladium phthalocyanine, platinum phthalocyanine and the like.

Preferable perylene colorants are perylenetetracarboxylic acid derivatives, and examples thereof are enumerated below (shown below by the symbols 1 to 8):

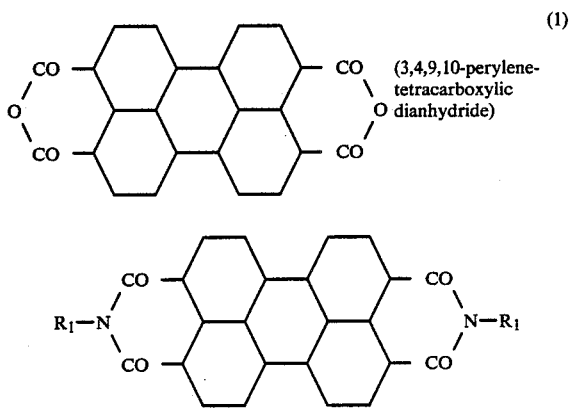

(1) (3,4,9,10-perylene-tetracarboxylic dianhydride)

(2) Compound of the above formula, wherein $R_1$ is —H;
(3) Compound of the above formula, wherein $R_1$ is —CH$_3$;
(4) Compound of the above formula, wherein $R_1$ is

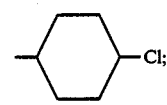

(5) Compound of the above formula, wherein $R_1$ is

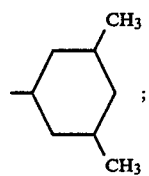

(6) Compound of the above formula, wherein $R_1$ is

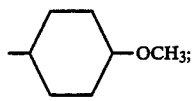

(7) Compound of the above formula, wherein $R_1$ is

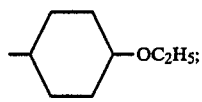

(8) Compound of the above formula, wherein $R_1$ is

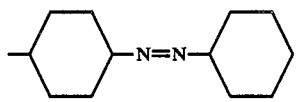

However, the perylenetetracarboxylic acid derivatives are not necessarily limited to these compounds.

Commercially available perylenetetracarboxylic acid derivatives include the following (all are trade names):
Pariogen Red L3870HD (produced by BASF)
Pariogen Red L3880HD (produced by BASF)
Novopalm Red BL (produced by Hoechst)
Peryndomaroon R6434 (produced by Bayer)
Peryndo Red R6418 (produced by Bayer)
Heriofastmaroon E3R (produced by Bayer)
Kayaset Scarlet E-2R (produced by Nippon Kayaku)
Kayaset Bordeaux E-D (produced by Nippon Kayaku)
Irgadine Red BPT (porduced by Ciba Geigy)

Isoindolinone colorants have aromatic fused polycyclic structures containing heteroatoms, and may be represented basically by the formula below.

Those not substituted with chlorine at positions 4, 5, 6 and 7 may also be included, but substituted type compounds are preferred with respect to light resistance and solvent resistance.

Depending on the structure of R in the formula, the color will vary from yellow to orange, even to reddish brown, and these colorants are particularly excellent as yellow colorants for colorfulness and sharp spectral characteristics.

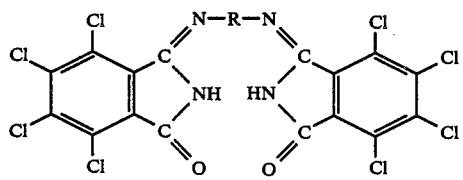

Typical examples of isoindolinone colorants may include those wherein R in the above formula is represented by the following groups:

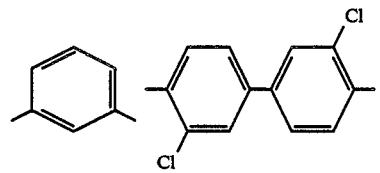

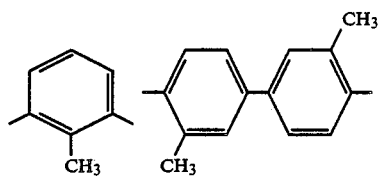

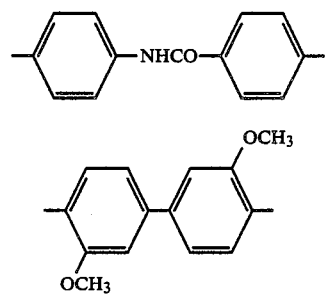

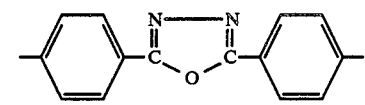

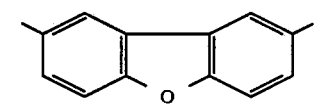

However, isoindolinone colorants are not necessarily limited to these compounds.

Commercially available isoindolinone colorants are as follows (all are trade names):
Irgadine Yellow 2GLT, 2GLTE, 2GLTN (produced by Ciba Geigy);
Rionogen Yellow 3GX (produced by Toyo Ink);
Fastgen Super Yellow GR, GRO, GROH (produced by Dainippon Ink);

Irgadine Yellow 2RLT, 3RLT, 3RLTN (produced by Ciba Geigy);
Rionogen Yellow RX (produced by Toyo Ink);
Risol Fast Yellow 1840 (produced by BASF);
Kayaset Yellow E-2RL, E-3RL176 (produced by Nippon Kayaku);

Chromophthal Orange 2G (produced by Ciba Geigy),
Irgadine Red 2BLT (produced by Ciba Geigy); and the like.

Anthraquinone colorants refer to derivatives of anthraquinone and similar quinones.

Typical examples of the structures of anthraquinone yellow colorants are shown below:

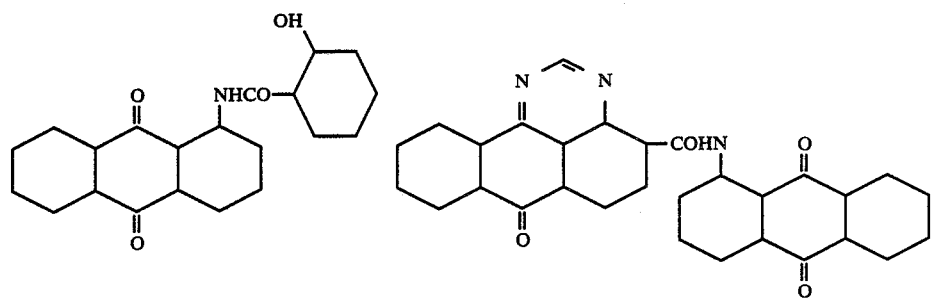

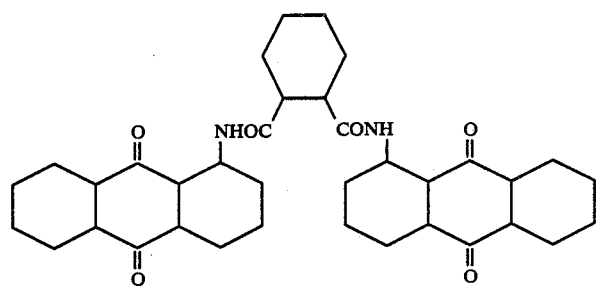

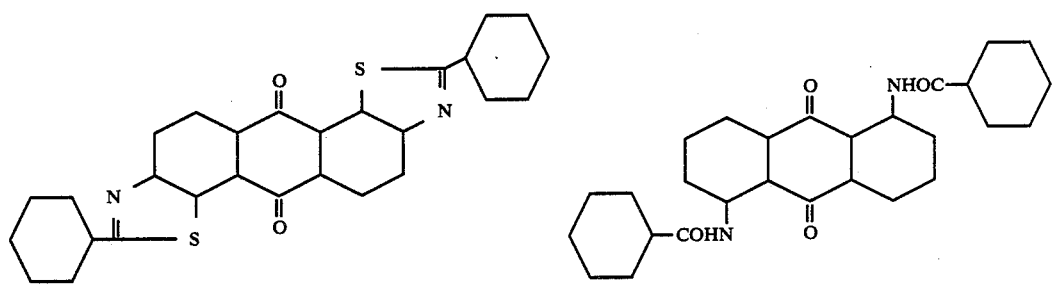

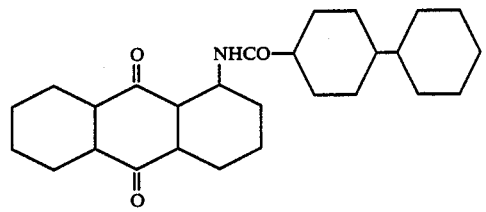

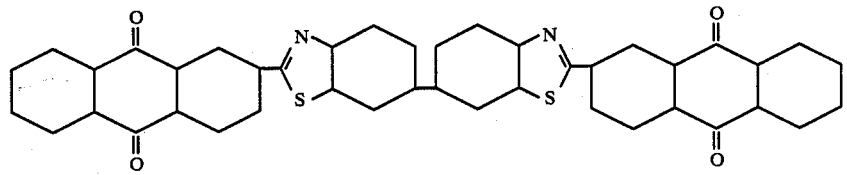

-continued
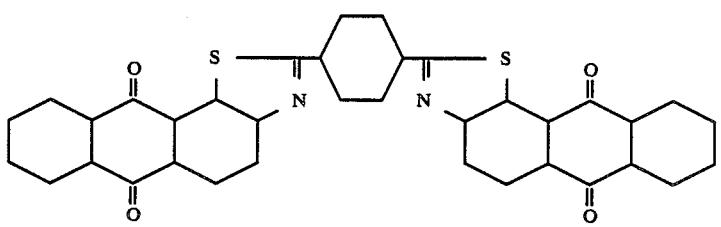
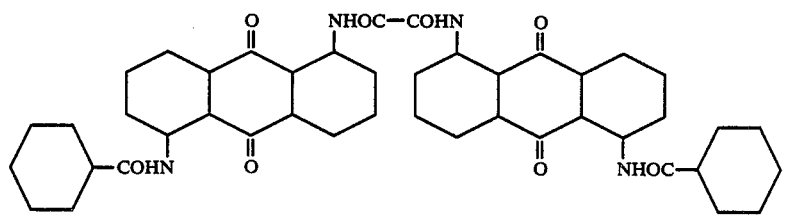
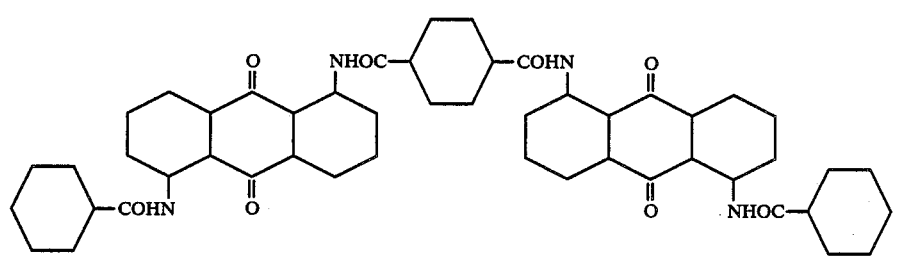
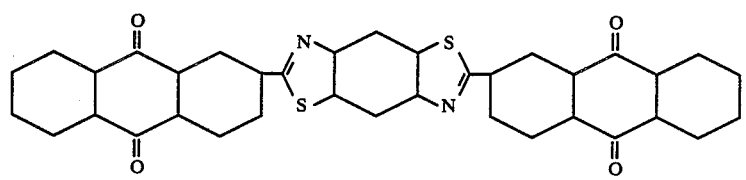
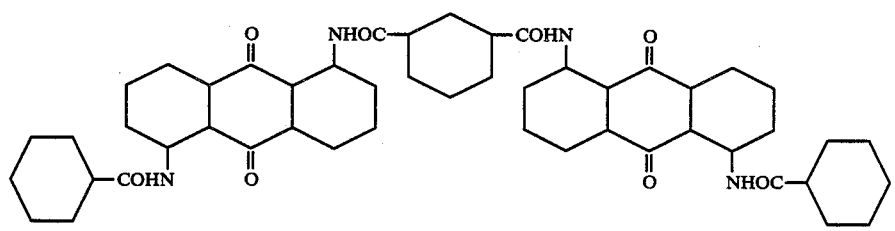
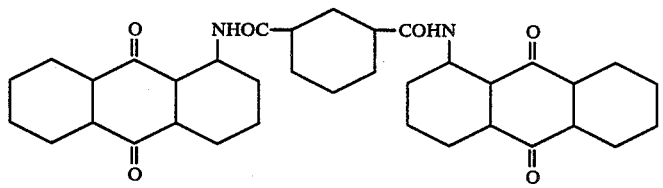
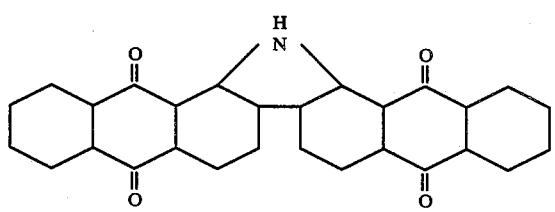

However, anthraquinone colorants are not necessarily limited to these examples.

Commercially available examples of such anthraquinone colorants are shown below (all are trade names):

Chromophthal Yellow A2R (produced by Ciba Geigy) C.I. No. 70600;
Heriofast Yellow E3R (produced by Bayer);
Pariogen Yellow L1560 (produced by BASF) C.I. No. 68420;
Kayaset Yellow E-R (produced by Nippon Kayaku) C.I. No. 65049;
Chromophthal Yellow AGR (produced by Ciba Geigy);
Biplast Yellow E2G (produced by Bayer);
Nihonthrene Yellow GCN (produced by Sumitomo Kagaku) C.I. No. 67300;
Mikethrene Yellow GK (produced by Mitsui Toatsu) C.I. No. 61725;
Indanthrene Printing Yellow GOK (produced by Hoechst) C.I. No. 59100;
Anthrazol Yellow V (produced by Hoechst) C.I. No. 60531;
Mikethrene Soluble Yellow 12G (produced by Mitsui Toatsu) C.I. No. 60605;
Mikethrene Yellow GF (produced by Mitsui Toatsu) C.I. No. 66510;
Nihonthrene Yellow GCF (produced by Sumitomo Kagaku) C.I. No. 65430;
Indanthrene Yellow 3G (produced by Bayer) C.I No. 65405;
Nihonthrene Yellow 4GL (produced by Sumitomo Kagaku);
Balanthrene Yellow PGA (produced by BASF) C.I. No. 68400;
Cibanone Yellow 2G (produced by Ciba Geigy);
Indanthrene Yellow F2GC (produced by Hoechst);
Anthrazol Yellow IGG (produced by Hoechst);
Indanthrene Yellow 5GF (produced by BASF);
Mikethrene Yellow 3GL (produced by Mitsui Toatsu);
Indanthrene Yellow LGF (produced by BASF);
Monolite Yellow FR (produced by ICI);
Kayaset Yellow E-AR (produced by Nippon Kayaku).

Quinacridone colorants have the basic skelton as shown by the formula (I), including also the derivatives derived therefrom:

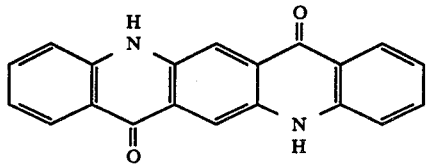

(I)

Examples of the derivatives may include the following compounds:

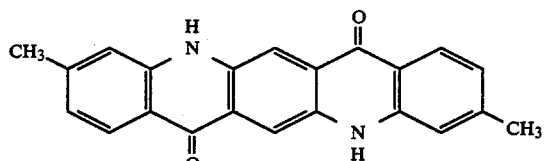

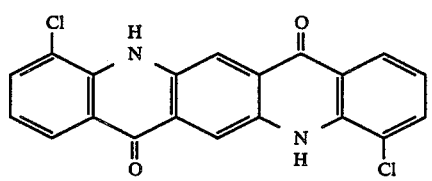

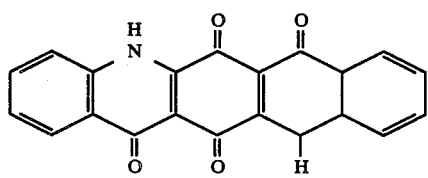

Mixtures of these compounds may also be included. All of them have excellent spectral characteristics of magenta colorants.

Typical examples of the colorants may include the following (all are trade names):

Rionogen Magenta R (trade name: produced by Toyo Ink);

Fastgen Supermagenta R, RS (trade names: produced by Dainippon Ink);

Sincacia Red BRT, YRT (trade names: produced by Du Pont);

Sincacia Violet BRT (trade name: produced by Du Pont).

In vapor deposition of such coloring matter (colorants), either a mask having a desired pattern is in advance disposed on protective layer 2906, or selective heating is performed, to form a coloring matter layer on desired portions of protective layer 2906, thereby forming filter 2907. Alternatively, uniform vapor deposition of such coloring matter may be performed temporally on the whole surface of protective layer 2906, and then the coloring matter layer on unwanted portions is removed using a photolithography technique, for example, dry etching, thereby forming filters 2907 on the desired portions of protective layer 2906.

For the purpose of color reading, as shown for example, in FIG. 29, an R filter 2907, a G filter 2907', and a B filter 2907" are provided respectively on photoreceptors of 3 successive photosensors to form a single pixel 2910 from signals from these three photoreceptors. The photosensor array will include a plurality of such pixels 2910 successively arranged.

Now the present invention will be described in detail with respect to its preferred embodiments.

EMBODIMENT 1

Figure 1:
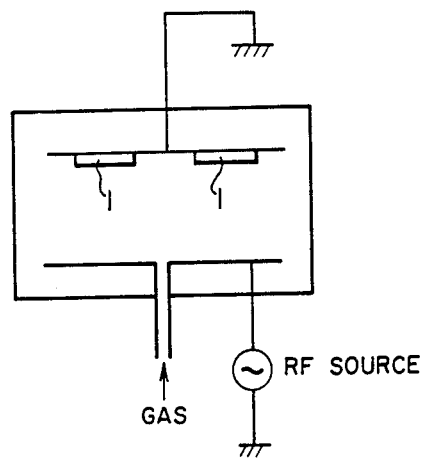
FIG. 1 is a schematic view of a device used in the method of the present invention.

A glass substrate (Corning "#7059"), both surfaces of which were already ground was washed regularly with a neutral detergent or an organic alkali detergent. The glass substrate 1 thus obtained was set in a capacitive-coupling glow discharge decomposition device such as shown in FIG. 1 and kept under a vacuum of $1 \times 10^{-6}$ Torr at a temperature of 230° C. Komatu Densi "epitaxial grade pure SiH4 gas" was then fed to the device at a flow rate of 10 SCCM to set the gas pressure to 0.07 Torr. A 13.56 MHz high frequency source was then used which performed glow dishcarge with a 2.0 kV input voltage and with 2-minute 120 W RF (Radio Frequency) discharge power, thereby forming an underlying layer of amorphous silicon including hydrogen atoms (referred to as underlying Si:H layer hereinafter), the resulting thickness of the underlying a-Si:H layer being of the order of 400 Å. Thereafter in 5 minutes, the input voltage was lowered slowly to 0.3 kV and glow discharge was then performed further with an input voltage of 0.3 kV and with 8 W discharge power for 4.5 hours, thereby forming an overlying a-Si:H layer of the order of 0.85μ.

A gas mixture of $SiH_4$ diluted with $H_2$ to 10% and $PH_3$ diluted with $H_2$ to 100 ppm, mixed at a mixing ratio of 1:10 was used as a material to deposit an n+ ohmic contact layer having a thickness of the order of 0.15 μ on the overlying layer with 30 W discharge power. An electron beam vapor deposition method was then used which deposited aluminum into a 0.3 μ-thick conductive layer.

Thereafter, a photoresist pattern having a desired shape was formed by a positive type photoresist (Shipley "AZ-1370"). Exposed portions of the conductive layer were removed with a solution consisting of phosphoric acid (85% by volume aqueous solution), nitric acid (60% by volume aqueous solution), glacial acetic acid, and water, mixed at a volume ratio of 16:1:2:1 (referred to as etching solution 1 hereinafter). Exposed n+ layers were then removed with 120 W RF discharge power and at 0.07 Torr gas pressure using CF gas dry etching (plasma etching) using a parallel-plate device. Then the photoresist was separated.

A photosensor having a structure similar to the resulting planar type photosensor is shown in FIGS. 2 and 3.

In FIG. 3, the boundary between underlying a-Si:H layer 2 and overlying a-Si:H layer 3 is clearly shown, but, in fact, the refractive index of this boundary varies continuously and has an intermediate quality between those of layers 2 and 3.

On the other hand, for the purpose of comparison, the surface of the same glass substrate as that mentioned above was treated for 30 seconds with a solution of hydrofluoric acid (49% by volume aqueous solution), nitric acid (60% by volume aqueous solution) and acetic acid, mixed at a volume ratio of 1:5:40. The substrate was then treated in the same way as those mentioned above except that no underlying a-Si:H layer was formed, thereby forming a planar photosensor (referred to as comparison photosensor A hereinafter).

Under the same conditions, light having a wavelength of λ max=565 nm was guided into the two kinds of photosensors from the side of the glass substrates 1 thereof and the resulting values of the photocurrent outputs from the photosensors were compared, with the result that those values were substantially the same. It will be understood that this exhibits that the presence of underlying a-Si:H layer 2 does not deteriorate the photocurrent characteristics.

Under the same conditions, heat cycle durability test of the two kinds of photosensors was performed with the result that it was known that no film peeling-off occurred; i.e. adequate adhesion was ensured.

EMBODIMENT 2

The same steps as those performed in the formation of the photosensor of the embodiment 1 were performed except that when underlying a-Si:H layer 2 was formed in the course of formation of the photosensor of the embodiment 1, glow discharge was performed with the combinations of first set discharge power (shortened hereinafter as discharge power 1) and discharge times at the discharge power 1, shown in the following Table 1:

TABLE 1

| Discharge power (W) | 80 | 50 | 30 | 8 | 4 |
|---|---|---|---|---|---|
| Discharge time (minutes) | 3 | 4 | 6 | 18 | 40 |

As a result, in the case of discharge power 80 and 50 W, desired photosensors were obtained with no films being peeled off. In the case of discharge power 30, 8 and 4 W, however, film peeling-off occurred in the photolithography step using photoresist AZ-1370 (including washing by ultrasonic washing mashine) and no desired excellent photosensors were obtained.

EMBODIMENT 3

Figure 4:
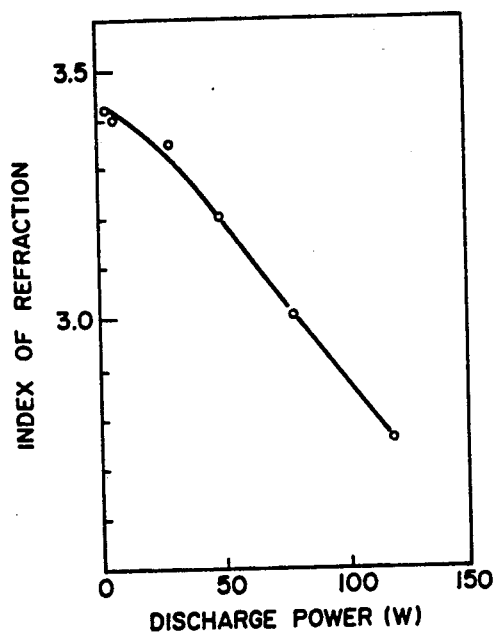
FIGS. 4 and 5 are graphs showing the characteristics of the underlying layer.

In the same way as that in the embodiments 1 and 2, underlying a-Si:H layer 2 was formed, substrate 1 was then taken out and the refractive index of underlying a-Si:H layer 2 formed on substrate 1 was measured. The relationship between the discharge power of glow discharge and the refractive index of underlying a-Si:H layer 2 is shown in FIG. 4.

Figure 5:
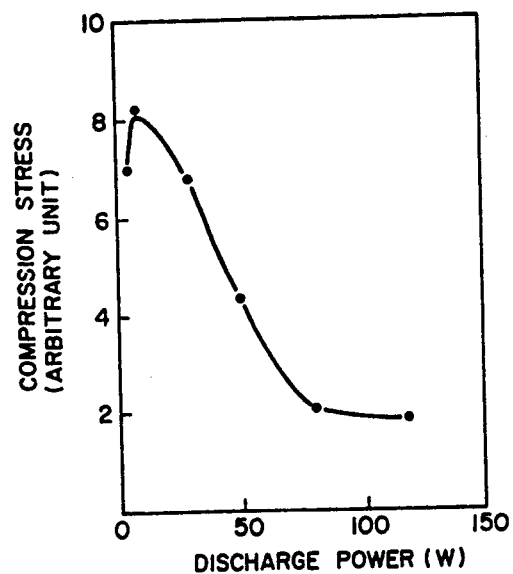

It is considered that adhesion between the substrate and the photoconductive layer is related to the discharge power of glow discharge and that film peeling-off is due to the total resultant stress of genuine stress induced depending on the inside structure of the thin film and internal stress depending on the difference in coefficient of thermal expansion between the substrate and the film. The total stress across the underlying a-Si:H layer 2 formed on substrate 1 was measured. The relationship between the discharge power 1 of glow discharge and the total stress of underlying a-Si:H layer 2 is shown in FIG. 5. It will be understood that stress appears in the form of compression stress, exhibits a maximum when discharge power 1 is in the vicinity of 10 W, and decreases as discharge power 1 increases. It is considered that the reason why stress decreases as discharge power 1 increases is that voids increasing in number in the film create tensile stress which then cancells the compression stress.

As described above, the photoconductivity of the photoconductive layer is related to the discharge power used in the film formation, and deposition is required to be performed at relatively low discharge power in order to obtain a required photoconductive characteristic. Therefore, overlying a-Si:H layer 3 in each of the above embodiments 1 and 2 was deposited with relatively low discharge power.

It will be understood from the above that the underlying a-Si:H layer 2 of the photosensor according to the present invention acts as a stress releasing layer and improves the adhesion between the substrate and the photoconductive layer. In the photosensor according to the present invention, the thickness of the underlying a-Si:H layer 2 should preferably be not so thick; for example, preferably 1,000 Å or thinner.

When light is to be introduced from the opposite side of a photosensor from substrate 1, influence on the photoconductive characteristics of the photosensor due to light absorption in underlying a-Si:H layer 2 need not to be considered. Therefore, underlying a-Si:H layer 2 may be considerably thick.

EMBODIMENT 4

The same steps as those of formation of the photosensor of the embodiment 1 were performed except that after formation of the overlying a-Si:H layer 3, glow discharge which was increased upto 80 W was performed for 25 minutes and that a further overlying a-Si:H layer was formed.

Figure 6:
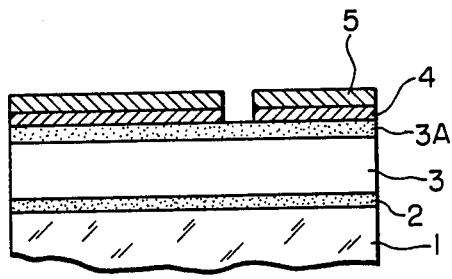
FIG. 6 is a cross-sectional view of a portion of another photosensor according to the present invention.

FIG. 6 is a partial cross-sectional view of the resulting planar photosensor, showing a similar part to that of FIG. 3. In FIG. 6, the same reference numeral is used to denote similar elements to those of FIG. 3. Reference numeral 3A' denotes an overlying a-Si:H layer, the thickness of which is 0.3$\mu$. The speed of forming a unit thickness of this layer is remarkably higher than that of forming a unit thickness of overlying a-Si:H layer 3 because the discharge power has been increased.

In the photosensor obtained in the present embodiment, underlying a-Si:H layer 2 and overlying a-Si:H layers 3 and 3' constitute the photoconductive layer. According to the photosensor of the present embodiment, the photocurrent obtained is larger than that of embodiment of because of an increased thickness of the overlying a-Si:H layer.

EMBODIMENT 5

The same steps as those of formation of the photosensor of the embodiment 1 were performed except that the substrate temperature was kept at 70° C. in the formation of underlying a-Si:H layer 2 and glow discharge was performed with 8 W discharge power for 15 minutes.

Underlying a-Si:H layer 2 was formed under the same conditions, substrate 1 was then taken out and the refractive index of underlying a-Si:H layer 2 was measured. The obtained refractive index was 3.10.

The photosensor obtained in the present embodiment was as excellent as the photosensor obtained in the embodiment 1.

EMBODIMENT 6

The same steps as those of formation of the photosensor of the embodiment 1 were performed except that SiH$_4$ diluted with H$_2$ to 5% was used as a source gas in the formation of underlying a-Si:H layer 2 and that glow discharge was performed with discharge power 1 of 30 W for 10 minutes.

Underlying a-Si:H layer 2 was formed under the same conditions, the substrate 1 was taken out and the refractive index of underlying a-Si:H layer 2 was measured. The obtained refractive index was 3.02.

The photosensor obtained in the present embodiment was as excellent as that obtained in the embodiment 1.

EMBODIMENT 7

The same steps as those of formation of the photosensor of the embodiment 1 were performed except that the gas pressure was kept at 0.30 Torr and glow discharge was performed with discharge power 1 of 50 W for 5 minutes in the formation of underlying a-Si:H layer 2.

An underlying a-Si:H layer was formed under the same conditions, the substrate 1 was taken out and the refractive index of underlying a-Si:H layer 2 was measured. The obtained refractive index was 3.12.

The photosensor obtained in the present embodiment was as excellent as that obtained in the embodiment 1.

EMBODIMENT 8

Figure 7:
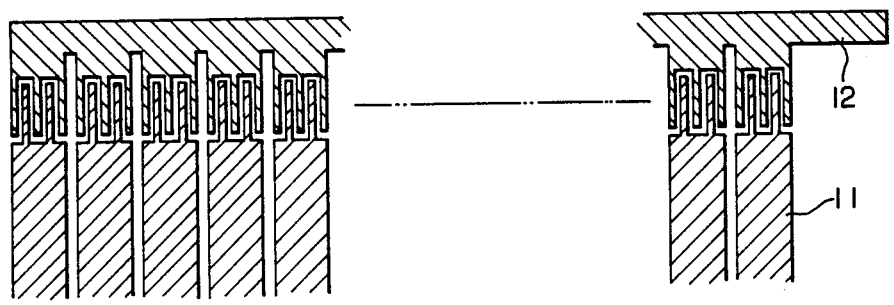
FIG. 7 is a plan view of a portion of a photosensor array according to the present invention.

An array of 864 photosensors was formed on the same substrate using the same method as that employed in the embodiment 1. This can be performed easily by setting a mask appropriately in the lithography process. The outlines of the photosensor array thus obtained are shown partially in a plan view in FIG. 7. In FIG. 7, reference numeral 11 denotes individual electrodes. Reference numeral 12 denotes a common electrode. This strip array of photosensors has a photoreceptor face density of 8 bits/mm and a length equal to the width of an A6 sized sheet.

The uniformity in photocurrent and dark current between the bits of the photosensor array obtained in the present embodiment was measured. The results of this measurement are shown in FIG. 8.

On the other hand, for the purpose of comparison, an array of 864 photosensors was formed on the same substrate, using the same substrate acid treatment-present and underlying layer-absent method as that employed for formation of the comparison photosensor A described with respect to the embodiment 1. The uniformity in photocurrent and dark current between the bits of the photosensor array thus formed was measured. The results of this measurement are shown in FIG. 9.

Figure 8:
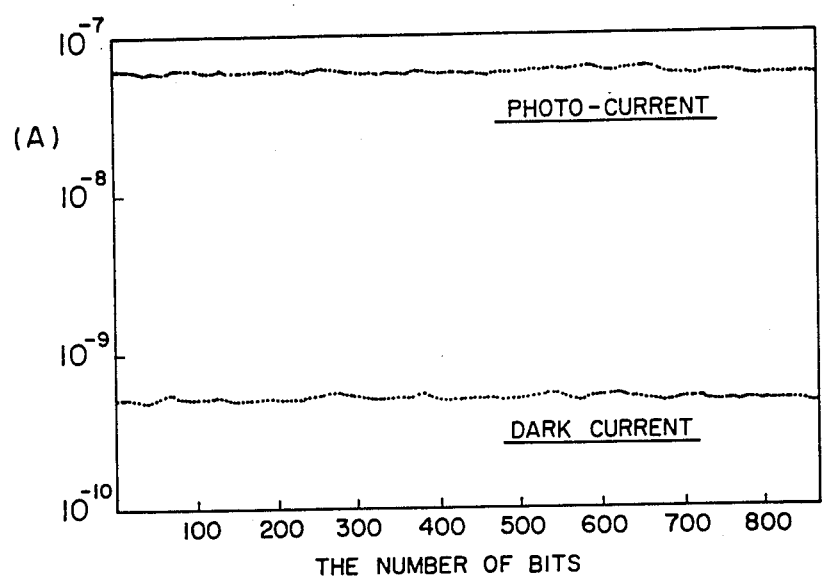
FIGS. 8 and 9 are graphs showing the photocurrent and dark current characteristics, respectively, of the photosensor array of FIG. 7.
Figure 9:
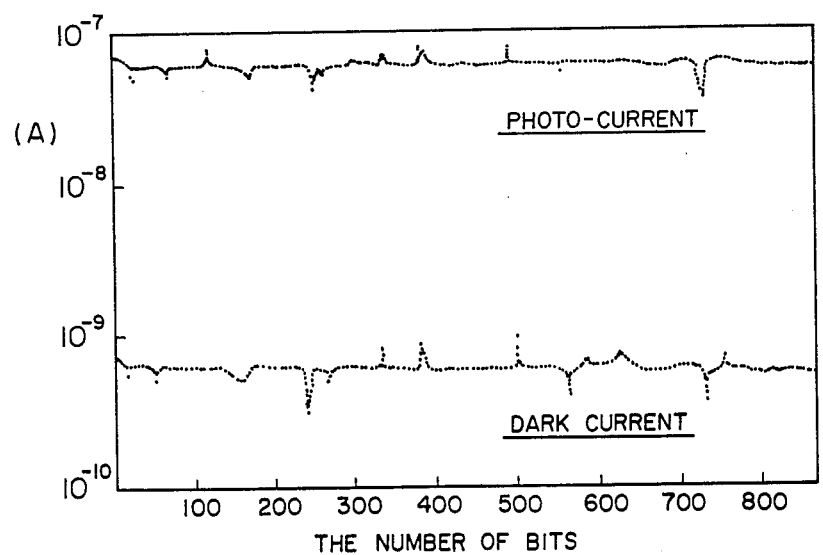

Comparison of FIGS. 8 and 9 shows that in the photosensor according to the present invention, no microscopic defects are present in the substrate and the underlying a-Si:H layer acts as a stress releasing layer, thereby bringing about very excellent uniformity of the photoconductive characteristics.

EMBODIMENT 9

An attempt has been made to divide a long (864-bit) photosensor array such as that obtained in the embodiment 8 into 27 blocks each including 32 bits to drive the matrices.

In more detail, a long photosensor array was formed in the same process as that performed in the embodiment 8. The whole surface of the array thus obtained was coated with polyimide resin (PIQ prepared by Hitachi Kasei) and then baked. A pattern having a desired shape was formed by a negative type photoresist (OMR-83 prepared by Tokyo Ouka). Unwanted portions of the baked PIQ was removed with a polyimide resin etching solution (PIQ ETCHANT produced by Hitachi Kasei) and the pattern OMR-83 was removed. And then it was cured at 300° C. for one hour in an atmosphere of nitrogen, thereby forming an insulating layer and through holes for wiring of the matrixes. Aluminum was deposited on the insulating layer into a thickness of $2\mu$ using electron beam evaporation and upper electrodes for matrix wiring were formed by positive type photoresist AZ-1370 using etching solution 1.

Figure 10:
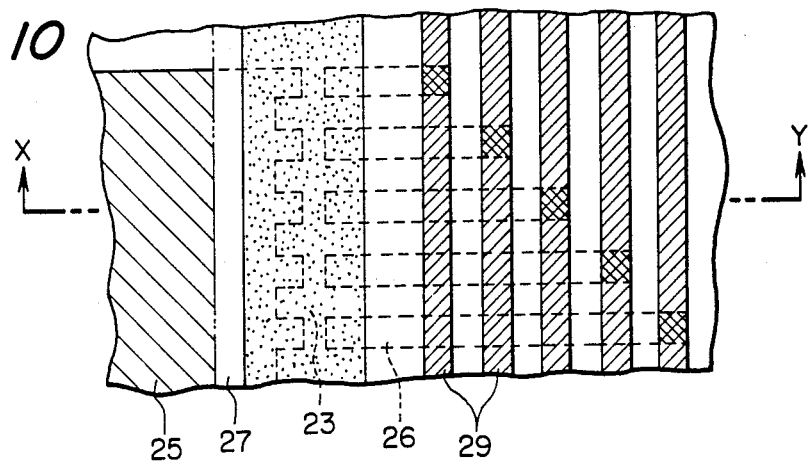
FIG. 10 is a plan view of a portion of a matrix section.
Figure 11:
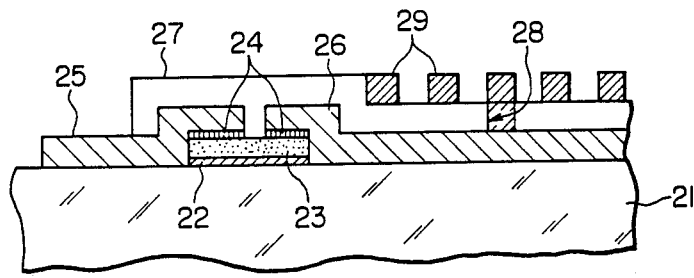
FIG. 11 is a cross-sectional view taken along line X-Y of FIG. 10.

FIG. 10 shows a partial plan view of the outline of the matrix wiring section of the photosensor array thus obtained. A cross-sectional view taken along line X-Y of FIG. 10 is shown in FIG. 11. In these figures, reference numeral 21 denotes a substrate; reference numeral 22 denotes underlying a-Si:H layer; reference numeral 23 denotes overlying a-Si:H layer; reference numeral 24 denotes n+ layer; reference numeral 25 denotes common electrodes; reference numeral 26 denotes individual electrodes; reference numeral 27 denotes insulating layer; reference numeral 28 denotes through holes; and reference numeral 29 denotes upper electrodes for the matrix wiring.

Figure 12:
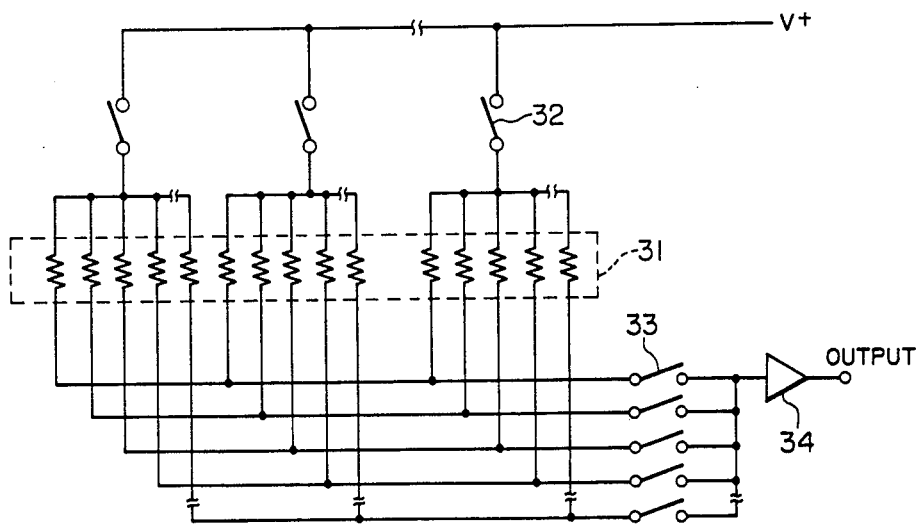
FIG. 12 shows a matrix drive circuit.

FIG. 12 shows a drive circuit which matrix drives the 8 bits/mm sensor array having a length equal to the width of an A6 sized sheet. In FIG. 12, reference numeral 31 denotes the photoconductive layers of a photosensor; reference numeral 32 denotes block selection switches; reference numeral 33 denotes a common switch; and reference numeral 34 denotes an amplifier.

Figure 13:
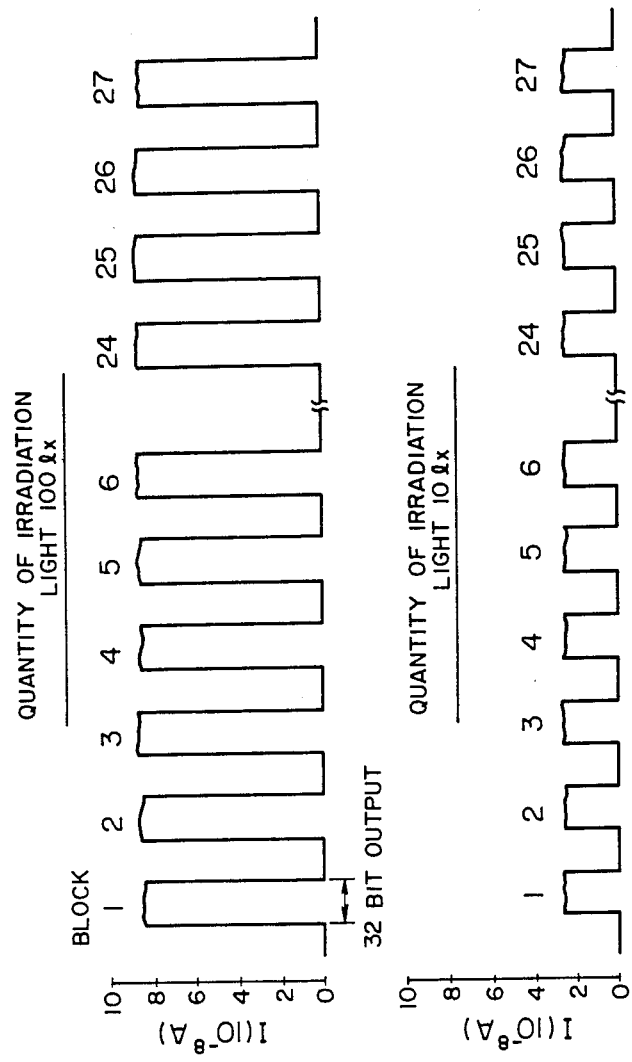
FIG. 13 is a graph of an output photocurrent from the matrix drive circuit of FIG. 12.

The uniformity of bit output photocurrents was measured $100\mu$ sec after application of a voltage to matrix drive the photosensor array. The results of this measurement are shown in FIG. 13. As will be understood in FIG. 13, respective bit output photocurrents show very excellent uniformity and signal reading is fully feasible by matrix driving.

While the above embodiment has shown an intermediate layer formed between underlying a-Si:H layer 2 having a fixed refractive index and overlying a-Si:H layer 3 having a fixed refractive index, the intermediate layer having a refractive index varying continuously through its thickness, the photosensor according to the present invention may include a layer, the refractive index of which varies slowly continuously from the substrate surface thereof through its thickness without forming underlying a-Si:H layer 2 having a fixed thickness and a fixed refractive index through its thickness.

Figure 14:
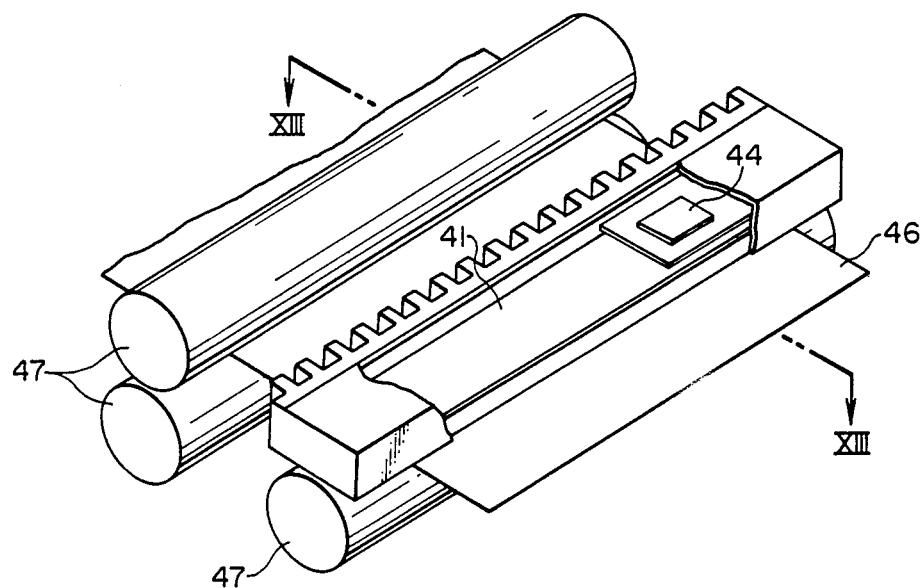
FIG. 14 is a perspective view of an image line sensor unit according to the present invention shown with a part of the unit removed.
Figure 15:
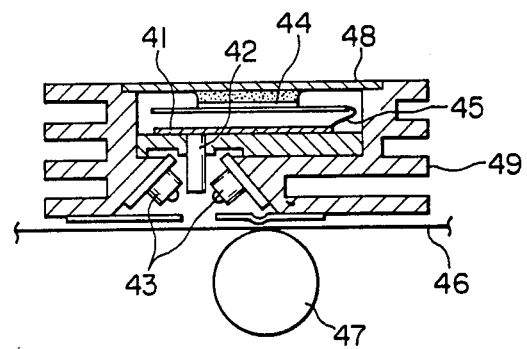
FIG. 15 is a cross-sectional view taken along

FIG. 14 is a perspective view of an image sensor unit used in the present embodiment with a part thereof being shown removed away. FIG. 15 is a cross-sectional view taken along line XIII—XIII. In these figures, reference numeral 41 denotes the substrate of a photosensor array. Provided below substrate 41 is a fiber lens array 42 on each side of which is provided a light emitting diode (LED) array 43. Reference numeral 44 denotes a drive IC which is electrically connected via a flexible conductive material 45 with a matrix wiring section on substrate 41. Reference numeral 46 denotes a document to be read; reference numeral 47 denotes feed rollers for the document; reference numeral 48 denotes a radiating or heat dissipation plate; reference numeral 49 denotes radiating fine. Drive IC 44 is thermally connected with radiating plate 48. The photosensor array, the fiber lens array 42 and the LED array 43 are parallel one to the other in the direction of their disposition.

EMBODIMENT 10

Figure 16:
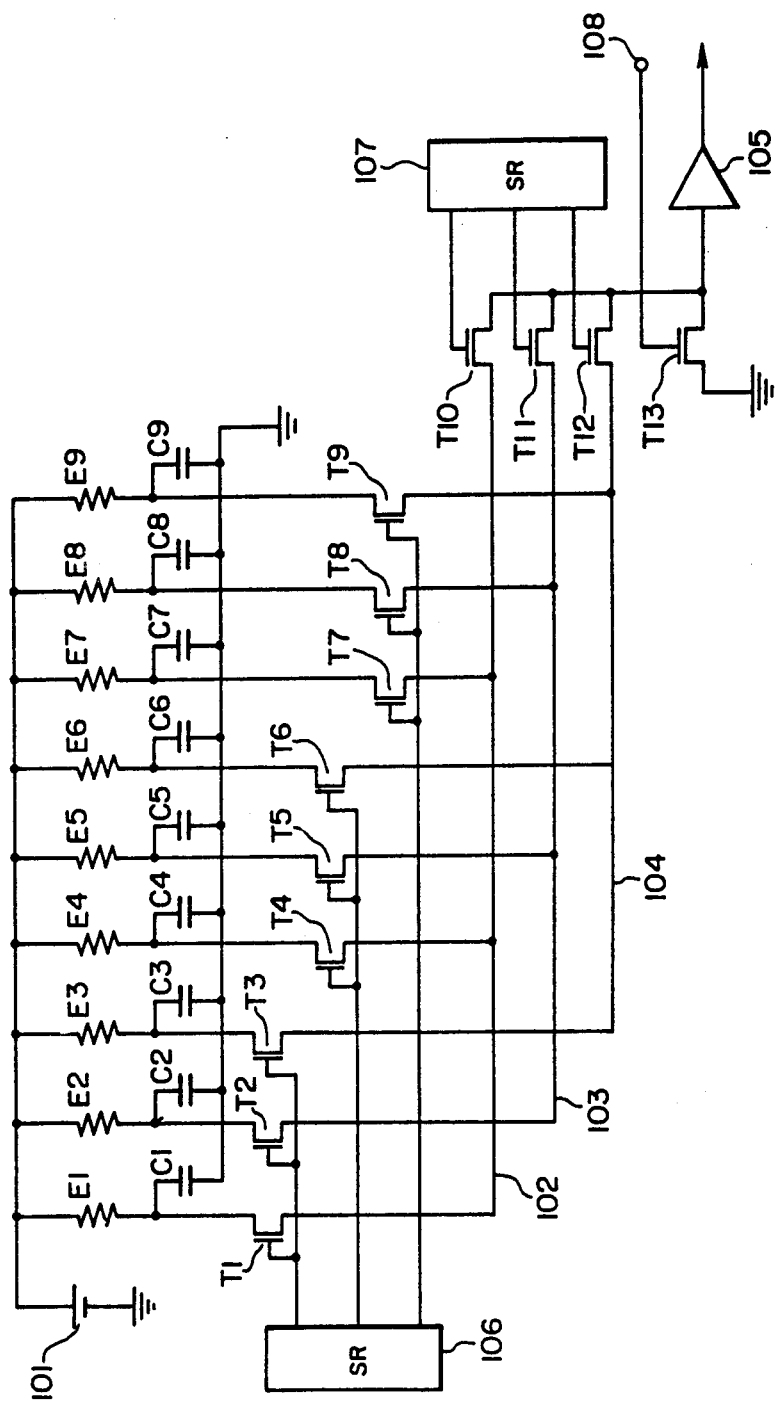
FIGS. 16 and 17 show examples of an image line sensor unit.

An image line sensor unit was composed of the photosensor array obtained in the embodiment 9, the circuit diagram for which is shown in FIG. 16.

In FIG. 16, photosensor E1–E9 constitute a photosensor array which is divided into 3 blocks, each including 3 photosensors. This applies to capacitors C1-C9 and switching transistors T1-T9 corresponding to photosensors E1-E9, respectively.

One-side electrodes (common electrodes) of photosensors E1-E9 are connected to a power supply 101 while the other-side electrodes (individual electrodes) are gounded via corresponding capacitors C1-C9.

The individual electrodes which have the same place in the respective blocks of photosensors E1-E9 are connected via corresponding transistors T1-T9 with corresponding common lines 102-104.

In more detail, the first switching transistors T1, T4, T7 of the corresponding blocks are connected with a correponding common line 102; the second switching transistors T2, T5, T8 of the corresponding blocks are conneted with a correponding common line 103; and the third switching transistors T3, T6, T9 of the corresponding blocks are connected with a corresponding common line 104.

Common lines 102-104 are connected via corresponding switching transistors T10-T12 with an amplifier 105.

The gate electrodes of switching transistors T1-T9 are divided into three blocks, the transistor gate electrodes of each of which are connected together and the resulting common junctions are connected with corresponding parallel output terminals of a shift register 106. The parallel output terminals of the shift register 106 produce high level outputs sequentially at predetermined timings, so that switching transistors T10-T12 are turned on sequentially for each block.

The gate electrodes of switching transistors T10-T12 are connected with parallel output terminals of a shift register 107. These parallel output terminals produce high level outputs sequentially at predetermined timings, so that switching transistors T10-T12 are turned on sequentially.

Switching transistors T10-T12 are connected together with a terminal which is grounded via a switching transistor T13 provided for discharge purposes, the gate electrode of transistor T13 being connected with a terminal 108.

The operation of an image line sensor unit having such structure will be described briefly.

When light is introduced into photosensors E1-E9, electric charges are stored in capacitors C101-C109 from power supply 101 depending on the intensity of the light.

Subsequently, shift registers 106 and 107 produce high level outputs sequentially at the respective timings. Now assume that a high level output has been produced from each of both the shift registers.

This causes the switching transistors T1-T3 of the first block and the switching transistor T10 connected to common line 102 to be turned on, thereby allowing the electric charges stored in capacitor C1 to input to amplifier 105 via switching transistor T1, common line 102 and switching transistor T10, and thus amplifier 105 outputs corresponding image data.

When the electric charges stored in capacitor C1 are read, a high level signal is applied to terminal 108, thereby turning on switching transistor T13. This causes the remaining charges in capacitor C1 to fully discahrge via switching transistor T1, common line 102, switching transistor T10 and switching transistor T13.

Subsequently, with the parallel outputs of shift register 106 being maintained at high level, shift register 107 is shifted sequentially and switching transistors T11, T12 are turned on sequentially. This causes reading and discharging, such as mentioned above, with respect to capacitors C2 and C3, thereby reading data stored therein sequentially.

When the reading of data for the first block ends in this way, shift register 106 is shifted sequentially and data for the second and third blocks are read in the same way as that mentioned above.

In this way, the data stored in capacitors C1-C9 are read serially and output as image data from amplifier 105.

Since the strip photosensor array of FIG. 16 has a capacitor to store electric charges, it can enlarge its output signal.

When photosensors E1-E9, capacitors C1-C9 and switching transistors T1-T9 are formed on the same substrate using thin film semiconductors, the number of junction points to external circuits is reduced.

EMBODIMENT 11

Figure 17:
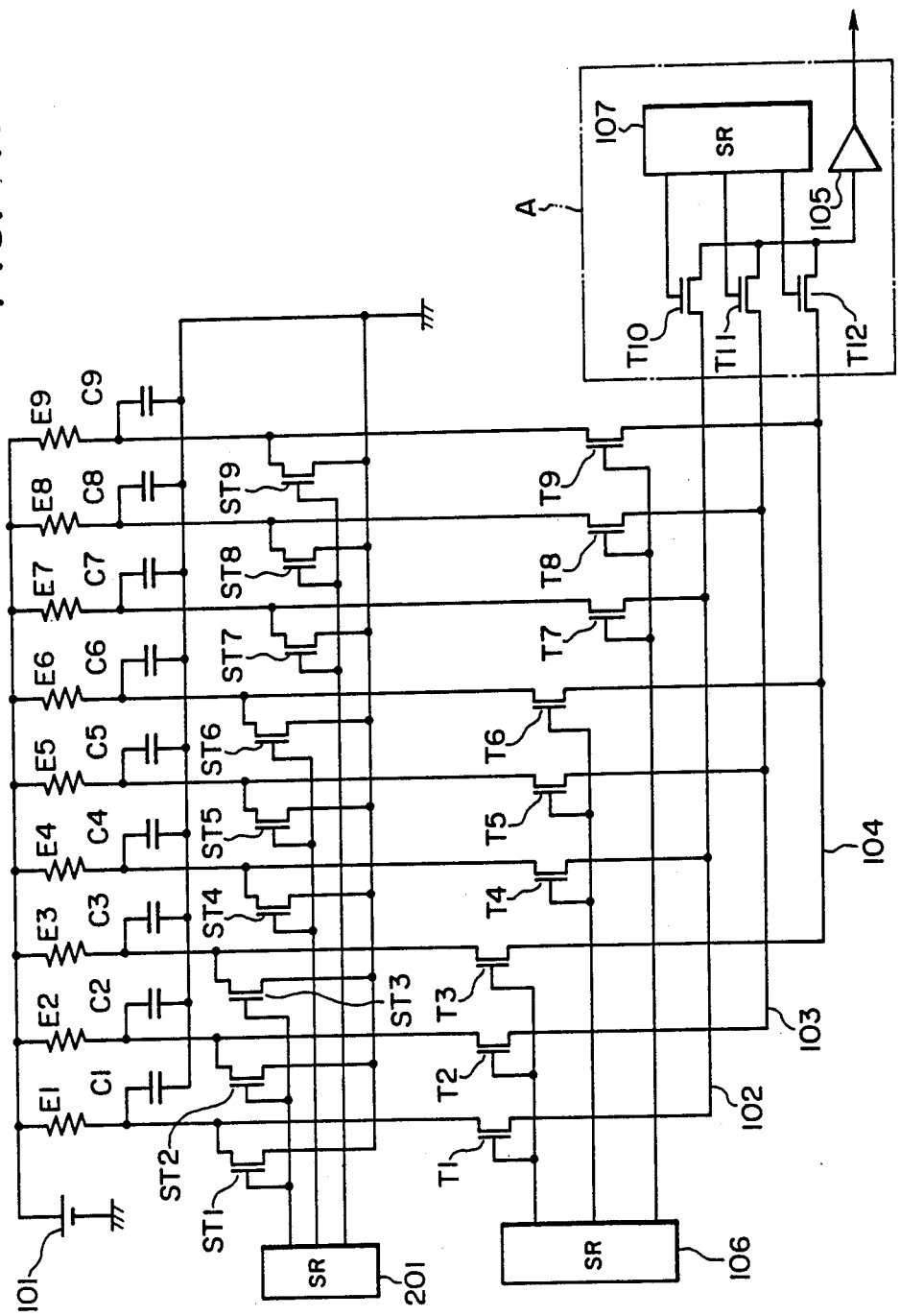

An image line sensor unit was formed using the photosensor array obtained in the embodiment 9. FIG. 17 is a circuit diagram of the line sensor unit.

In the present embodiment, however, the structures of photosensors E1-E9, capacitors C1-C9, switching transistors T1-T12 and shift registers 106 and 107 are the same as those shown in FIG. 16 and the description thereof will be omitted.

In FIG. 17, the individual electrodes of photosensors E1-E9 are grounded via corresponding switching transistors ST1-ST9; i.e., these transistors are connected in parallel with corresponding capacitors C1-C9.

The gate electrodes of switching transistors ST1-ST9 are divided into three blocks, the transistor gate electrodes of each of which are connected together as in the gate electrodes of switching transistors T1-T9, and the resulting junction points are connected with corresponding parallel output terminals of shift register 201.

Therefore, ones, for each block, of switching transistors T1-T9 are turned on by the shift timings of shift register 201.

Figure 18:
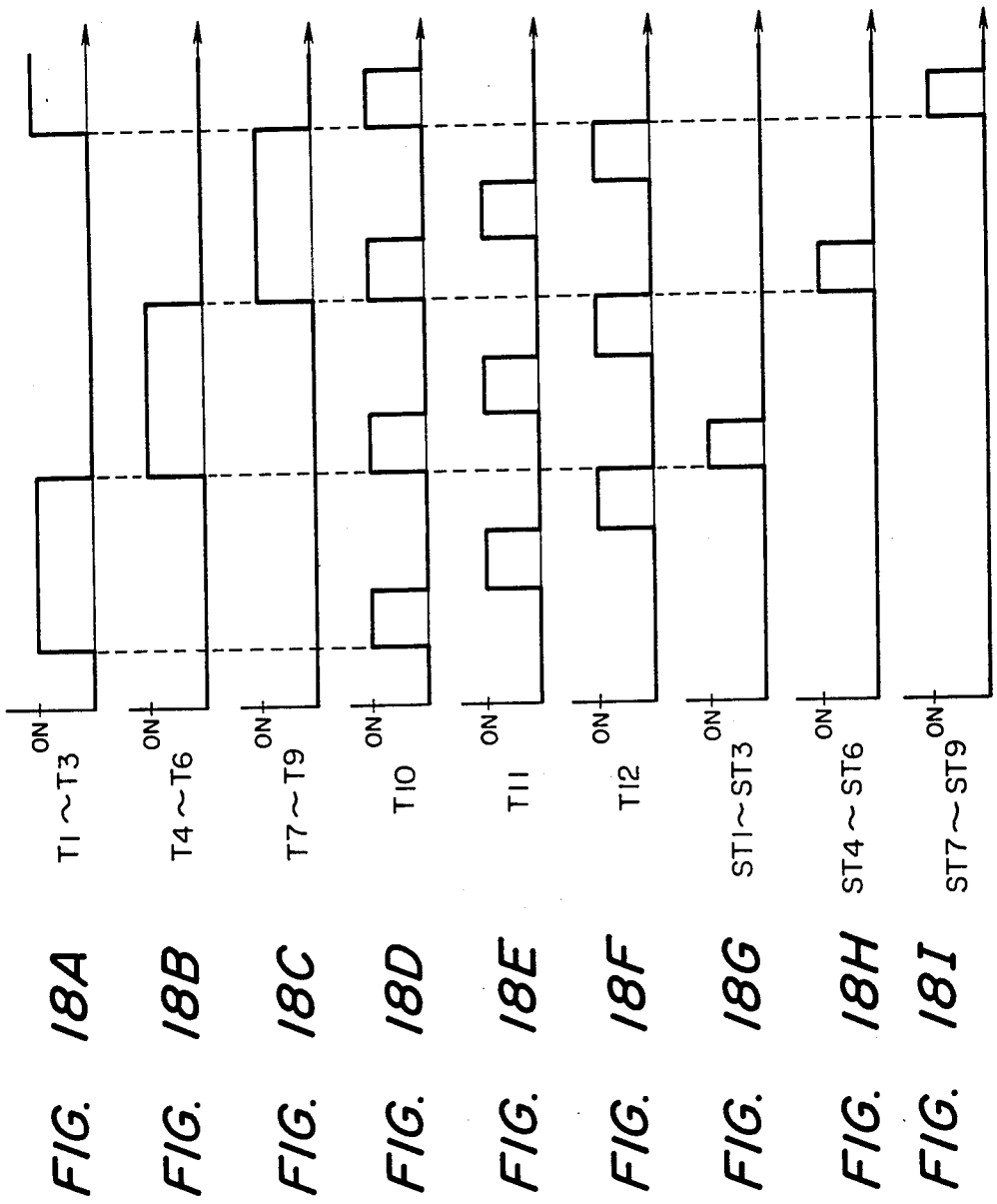
FIGS. 18A to 18I are timing charts.

Now the operation of the present embodiment having such structure will be described using the timing charts for switching transistors T1-T12 and ST1-ST9 shown in FIG. 18.

First, when light is introduced into photosensors E1-E9, electric charges are stored in capacitors C1-C9 form power supply 101 depending on the intensity of the light.

High level outputs are then produced from the first parallel terminals of shift register 106, thereby turning on switching transistors T1-T3 (FIG. 18A).

In the meantime, shift register 107 shifts and switching transistors T10-T12 are turned on sequentially (FIGS. 18D-F). That is, optical data stored in capacitors C1-C3 of the first block are read sequentially.

When data on the last capacitor C3 of the first block is read, shift register 106 is shifted, high level signals are output from the second parallel terminals, thereby turning on switching transistors T4-T6 (FIG. 18B).

Simultaneously, high level signals are output from the first parallel terminals of shift register 201, switching transistors ST1-ST3 are turned on, and the remaining electric charges in capacitors C1-C3 are completely discharged (FIG. 18(G)).

In parallel with this discharge operation while switching transistors T4-T6 are on, shift register 107 is shifted, thereby turning on transistors T10-T12 sequentially and optical data stored in capacitors C4–C6 of the second block are read sequentially (FIGS. 18D–F).

Next, in parallel with the reading operation of the third block (FIG. 18C), capacitors C4–C6 of the second block is discharged (FIG. 18H), and the above operation is repeated for each block.

As described above, in parallel with reading of the next block, a capacitor of the block, the reading of which has just ended, can be discharged, thereby shortening operating time as a whole.

Figure 19:
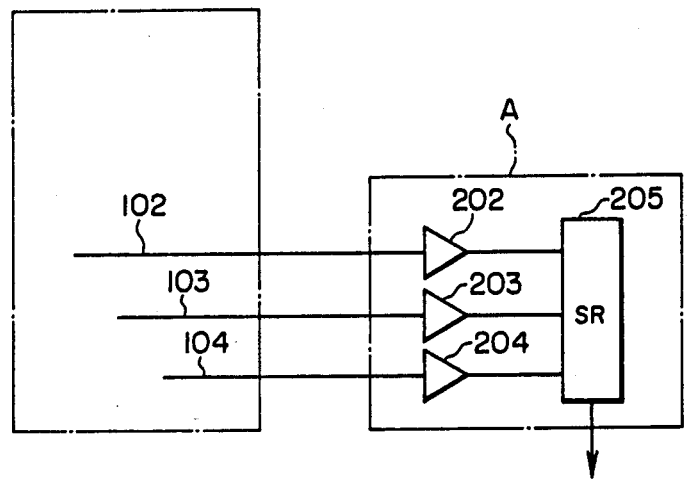
FIG. 19 shows a modification of the unit of FIG. 17.

FIG. 19 shows another embodiment of the present invention which differs from the embodiment of FIG. 17 only in the part A.

In more detail, amplifiers 202–204 are connected with corresponding common lines 102–104 and the outputs of amplifiers 202–204 are connected with parallel input terminals of shift register 205 which then outputs corresponding image data serially from its serial output terminals.

In other words, in this arrangement, data for one block are simultaneously input to shift register 205 and then this shift register is shifted thereby outputting serial image data.

Also, in the present embodiment, when data for one blocks is output from shift register 205, discharge of the capacitors of the block and reading of the next block can be performed in parallel.

Switching transistor ST1–ST9 may include thin film transistors as transistors T1–T9, in which case they can be formed on the same substrate together with other elements.

Although thin film transistors may be used for switching transistors ST1–ST9, discahrge of the capacitors of a certain block can be performed in parallel with reading of the next block, so that the total reading time is shortened compared with that in the embodiment 10.

EMBODIMENT 12

Figure 22:
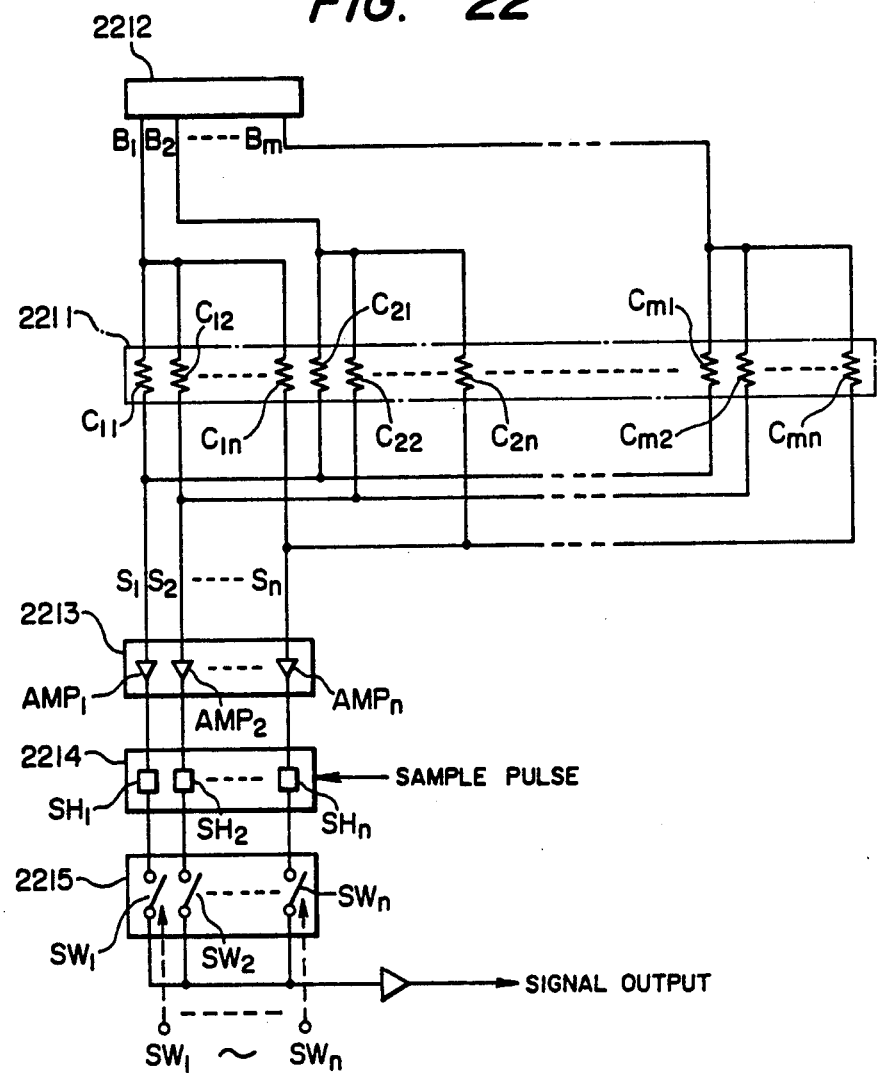
FIGS. 22 and 25 are a matrix drive circuit each.

FIG. 22 shows a drive circuit which drives a matrix of 32 bits×27 blocks to which are divided a strip photosensor array (FIGS. 20 and 21), formed in substantially the same way as the embodiment 19. In FIG. 22, reference numeral 2211 denotes the photoconductive layers of photosensor array; reference numeral 2212 denotes shift register; reference numeral 2213 denotes current amplifiers; reference numeral 2214 denotes sample and hold means; and reference numeral 2215 denotes a switching array.

Figure 23:
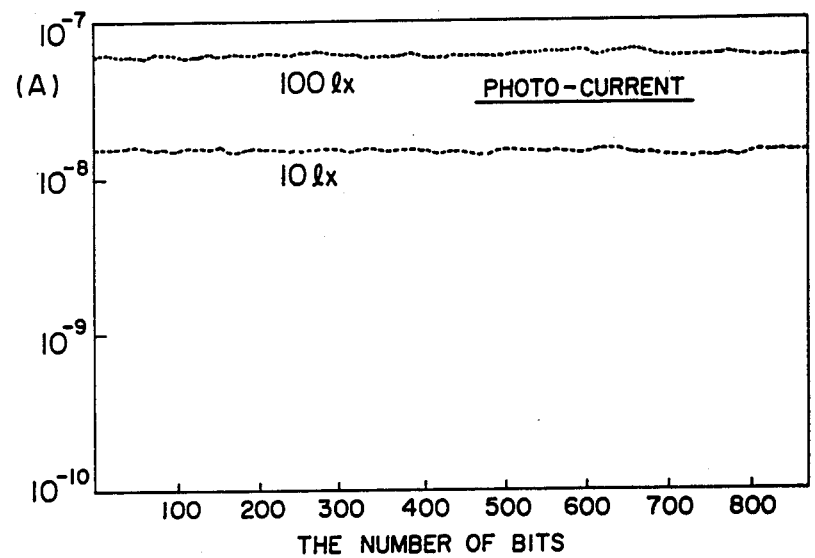
FIGS. 23 and 24 are each the photocurrent characteristic of a respective photosensor array.

FIG. 23 shows the values of the photocurrents derived when the above photosensor array was driven by the circuit of FIG. 22 with the photosensor array being put under irradiation with light of 100 1× and 10 1× from the side of substrate 1. It will be understood that there is reduced uniformity between bit photocurrents.

On the other hand, for the purpose of comparison, the surface of the same glass substrate as that mentioned above was treated for 30 seconds with a solution of hydrofluoric acid (49% by volume aqueous solution), nitric acid (60% by volume aqueous solution) acetic acid, mixed at a volume ratio of 1:5:40. The substrate was then treated in the same way as that mentioned above except that no underlying a-Si:H layer was formed, thereby forming a planar photosensor array (referred to as comparison photosensor array B hereinafter).

Figure 24:
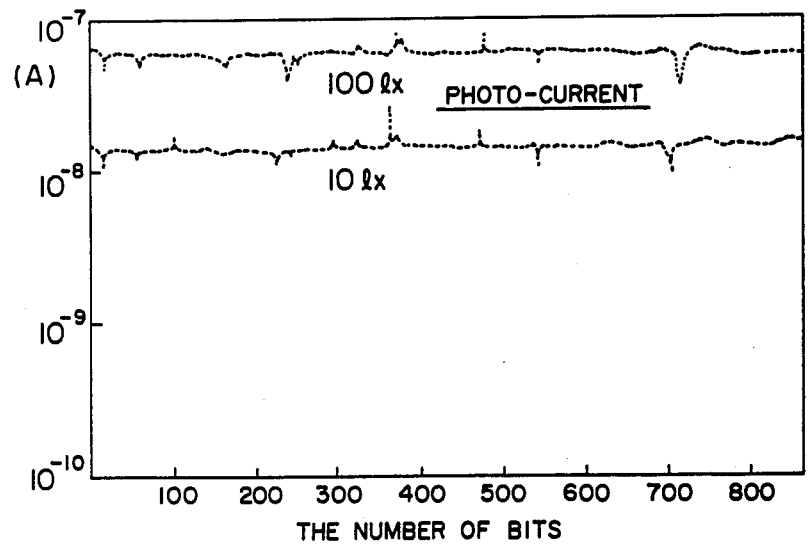
Figure 25:
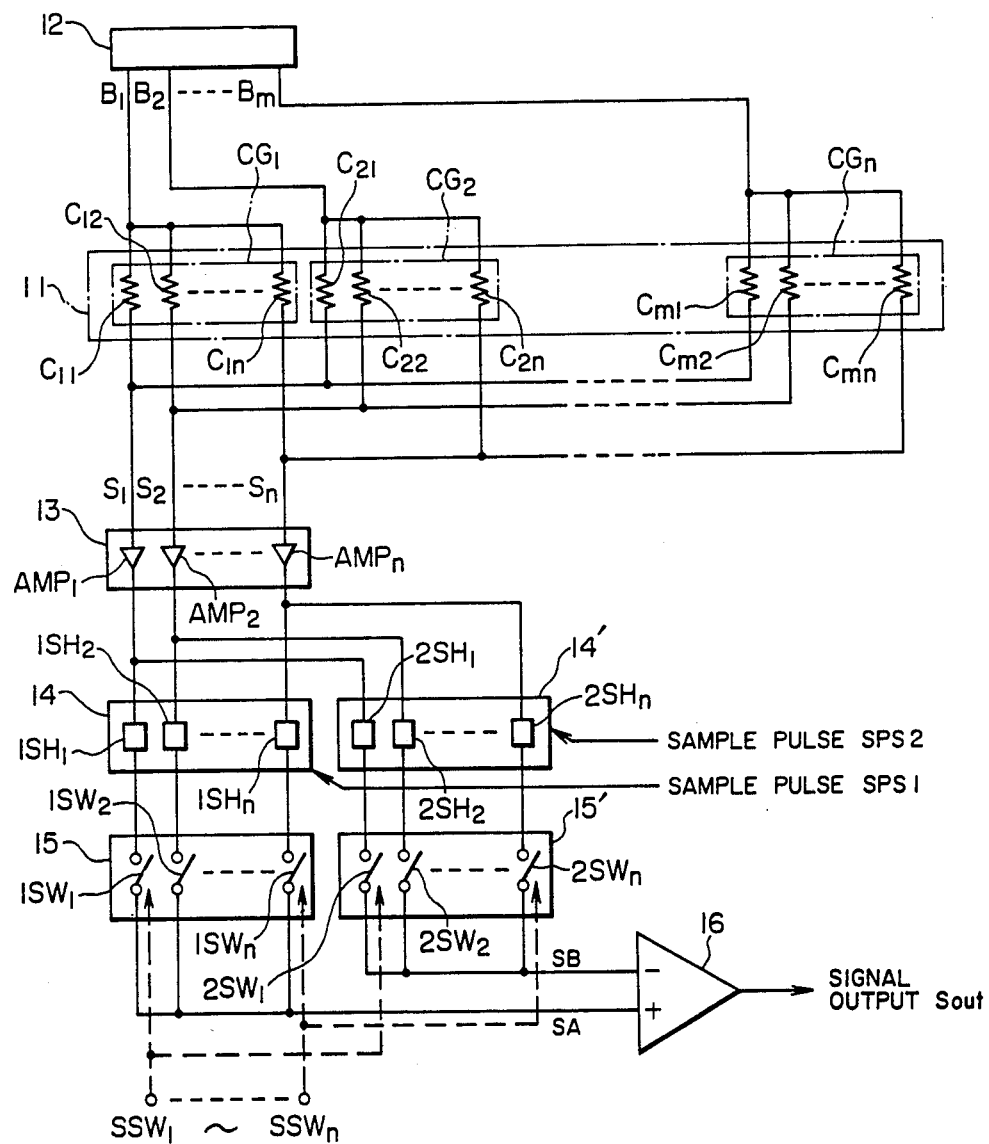

FIG. 24 shows the values of the photocurrents derived when the comparison photosensor array B was matrix driven by the drive circuit of FIG. 22 with the array put under irradiation of light of 100 1× and 10 1× from the side of the substrate thereof. It will be understood that there is a large ununiformity between bit photocurrents.

As will be understood from comparison of FIGS. 23 and 24, the obtained values of bit photocurrents of FIG. 23 are substantially the same as those of the corresponding bit current of FIG. 24. Thus it will be understood that the presence of the underlying a-Si:H layer 2 of the photosensor array according to the present invention does not deteriorate the photocurrent characteristics.

The two kinds of photosensor arrays mentioned above were tested for heat cycle durability under the same conditions. The results showed that in those arrays, no films were peeled off; sufficient adhesion was ensured.

EMBODIMENT 13

A glass substrate (Corning "#7059"), both the surfaces of which were already ground, was washed regularly with a neutral detergent or an organic alkali detergent. Chromium was then deposited on the substrate thus obtained to a thickenss of $0.15\mu$ using electron beam deposition. A photoresist pattern having a desired shape was then formed by positive type photoresist (Shipley "AZ-1370"). Unwanted deposited chromium was then removed using an aqueous solution of mixed ceric ammonium nitrate and perchloric acid, thereby forming lower capacitor electrodes 2607 and gate electrodes 2608.

Subsequently, glass substrate 2601 covered with a desired pattern mask was set within a capacitive-coupling type glow discharge decomposition device shown in FIG. 1 and maintained at 230° C. under a vacuum of $1\times10^{-6}$ Torr. Komatu Densi "epitaxial grade pure SiH$_4$ gas" was then fed into the device at a flow rate of 10 SCCM to set the gas pressure to 0.07 Torr. A 13.56 MHz high frequency source was then used which performed glow discharge for 2 minutes with a 2.0 kV input voltage and with 120 W RF(Radio Frequency) discharge power, thereby forming on the substrate an underlying a-Si:H layer 2602 haivng a thickness of the order of 400 Å. Subsequently, the input voltage was lowered slowly to 0.3 kV in 5 minutes and glow discharge was further performed with an input voltage of 0.3 kV and with 8 W discharge power for 4.5 hours, thereby forming an overlying a-Si:H layer 2603 having a thickness of the order of $0.85\mu$.

A gas mixture of SiH$_4$ diluted with H$_2$ to 10% and PH$_3$ diluted with H$_2$ to 100 ppm, mixed at a mixing ratio of 1:10, was used a material thereby to deposit an n$^+$ ohmic contact layer having a thickness of the order of $0.15\mu$ with 30 W discharge power.

SiH$_4$ diluted with H$_2$ to 10% was fed to the device at a flow rate of 5 SCCM and at the same time, NH$_3$ was also fed to the device at a flow rate of 20 SCCM. Glow discharge was then performed with 15 W discharge power for 2 hours, thereby forming an insulation (silicon nitride) layer 2609 having a thickness of $0.3\mu$.

In the same way as the formation of the a-Si:H layer 3 of photoelectric conversion section, SiH$_4$ diluted with H$_2$ to 10% was fed to the device at a flow rate of 20 SCCM, glow discharge was performed with 20 W for 30 minutes, thereby forming an a-Si:H layer 2610 having a thickness of $0.20\mu$. Also, an n$^+$ layer having a thickness of $0.1\mu$ was formed in the same way as the formation of n$^+$ layer 2604 of the photoelectric conversion section.

A desired pattern was then formed, and dry etching was performed with 100 W RF discharge power and with a CF gas having a gas pressure of 0.30 Torr using plasma etching, thereby removing unwanted n+ layer 2609 portions and semiconductor layer 2610 portions.

The mask at the photoelectric conversion section was then removed, aluminum was deposited into a thickness of 0.5μ, thereby forming a conductive layer. Subsequently, a photoresist pattern having a desired shape was formed with positive type photoresist (Shipley "AZ-1370"). Exposed conductive layer portions were then removed with an etching solution which contained phosphoric acid (85% by volume aqueous solution), nitric acid (60% by volume aqueous solution), glacial acetic acid, and water, mixed at a volume ratio of 16:1:2:1, thereby forming common electrodes 2605, individual electrodes 2606 and signal taking-out lines 2612. Exposed n+ layer portions were removed by dry etching using CF gas at 0.07 Torr and with 120 W RF discharge power using plasma etching which used the parallel plate device, thereby forming n+ layers 2604 and 2611 of the desired pattern. The photoresist was then separated.

Thus a photosensor array having 864 photosensors such as shown in FIGS. 26 and 27 resulted.

On the other hand, for the purpose of comparison, the surface of the same glass substrate as that mentioned above was treated for 30 seconds with a solution of hydrofluoric acid (49% by volume aqueous solution), nitric acid (60% by volume aqueous solution) and acetic acid, mixed at a volume ratio of 1:5:40. The substrate was then treated in the same process as that just mentioned above, thereby forming a planar type photosensor array (referred to as comparison photosensor array C hereinafter), except that no underlying a-Si:H layer was formed.

Under the same conditions, light having a wavelength of λ max=565 nm was guided into the two kinds of photosensors, mentioned above, from the side of the glass substrates 1 thereof and the resulting values of the photocurrent outputs from the photosensors were compared, with the result that both the values were found to be substantially the same. It will be understood that this exhibits that the presence of underlying a-Si:H layer 2 does not deteriorate the photocurrent characteristics.

Under the same conditions, heat cycle durability test of the two kinds of the photosensors was performed with the result that it was found that no films were peeled off; i.e., adequate adhesion was ensured.

EMBODIMENT 14

A glass substrate (Corning "#7059"), both the surfaces of which were already ground, was washed regularly with a neutral detergent or an organic alkali detergent. The glass substrate 1 thus obtained was set together with a mask having a desired pattern covering the substrate within a capacitive-coupling glow discharge decomposition device and kept under a vacuum of $1\times10^{-6}$ Torr at a temperature of 230° C. Komatu Denshi "epitaxial grade pure SiH4 gas" was then fed to the device at a flow rate of 10 SCCM to set the gas pressure to 0.07 Torr. A 13.56 MHz high frequency source was then used which performed glow discharge with a 2.0 kV input voltage and with 2-minute 120 W RF (Radio Frequency) discharge power, thereby forming an underlying a-Si:H layer 2901 having a thickenss of 400 Å. Thereafter, the input voltage was lowered slowly to 0.3 kV in 5 minutes and glow discharge was then performed further at an input voltage of 0.3 kV and at 8 W discharge power for 4.5 hours, thereby forming an overlying a-Si:H layer 3 having thickness of the order of 0.85μ.

Subsequently, a gas mixture of SiH4 diluted with H2 to 10% and PH3 diluted with H2 to 100 ppm, mixed at a mixing ratio of 1:10, was used as a material to deposit an n+ ohmic contact layer having a thickness of the order of 0.15μ on the overlying layer at 30 W discharge power. An electron beam vaper deposition method was then used which deposited aluminum into a 0.3μ-thick conductive layer.

Thereafter, a photoresist pattern having a desired shape was formed by a positive type photoresist (Shipley "AZ-1370"). Exposed portions of the conductive layer were removed in a solution consisting of phosphoric acid (85% by volume aqueous solution), nitric acid (60% by volume aqueous solution), glacial acetic acid, and water, mixed at a volume ratio of 16:1:2:1. Exposed n+ layer were then removed at 120 W RF discharge power and at 0.07 Torr gas pressure using CF gas dry etching in the plasma etching method using a parallel-plate device. Then the photoresist was then separated.

Silicon nitride layer was then formed by using a gas mixture of SiH4 diluted with H2 to 10% and NH3, mixed at a mixing ratio of 1:5 and by performing glow discharge at 30 W discharge power at a gas pressure of 0.1 Torr for 2 hours, thereby forming a silicon nitride layer having a thickness of 0.7μ.

A positive type photoresist (Tokyo Oka "ODUR 1013") was coated on this protective layer to a film thickness of 10,000 Å using Spinner coating. The resulting intermediate product was prebaked at 120° C. for 20 minutes, mask exposed to far-infrared radiation, dipped for 3 minutes in the developing solution used exclusively for the ODUR 1010 series, and dipped for 2 minutes in the rinse used exclusively for the ODUR series, thereby forming a resist mask. The whole surface of the photosensor array at which the resist mask formed was exposed to be dissolved in a solvent. The photosensor array and an Mo boat filled with Cu phthalocyanine were placed within a vacuum container and the Mo boat was heated up to 450°–550° C. under a $10^{-5}$–$10^{-6}$ Torr vacuum to evaporate Cu phthalocyanine into a 2,000 Å-thick film. It was then dipped in the developing solution used exclusively for the ODUR 1010 series and the developing solution was stirred to dissolve the photoresist mask while removing unwanted portions of the evaporated film, thereby forming a patterned blue coloring matter layer. In a similar process, a color filter and hence a color photosensor were formed using CIBAGEIGY "IRGAZIN Red BPT (CI No. 71127)" as red coloring matter, and Pb phthalocyanine as green coloring matter.

On the other hand, for the purpose of comparison, the surface of the same glass substrate as that just mentioned above was treated for 30 seconds with a solution of hydrofluoric acid (49% by volume aqueous solution), nitric acid (60% by volume aqueous solution) and acetic acid, mixed at a volume ratio of 1:5:40. The substrate was then treated in the same way as that mentioned above, except that no underlying a-Si:H layer was formed, thereby forming a planar photosensor array (referred to as comparison photosensor array D hereinafter).

Under the same conditions, white light was guided into the two kinds of color photosensors, mentioned above, from the side of the corresponding color filters and the resulting values of the photocurrent outputs from the photosensors were compared, with the result that both the values were found to be substantially the same. Thus it will be understood that this exhibits that the presence of underlying a-Si:H layer 2 in the photosensor according to the present invention does not deteriorate the S/N ratio.

Under the same conditions, heat cycle durability test of the two kinds of the photosensors was perfromed with the result that it was sound that no films were peeled off; i.e., adequate adhesion was ensured.

EMBODIMENT 15

A color photosensor was formed in the same way as the embodiment 14 except that a red color filter including a red coloring matter layer having a film thickness of the order of 2,000 Å was formed by heating HOECHST "NOVOPERM Red BL" coloring matter up to 400°-500° C.

The color filter of the photosensor thus obtained and a color filter, formed using a dyeing technique, were compared in performance:

(1) Heat Resistance:

A heat resistance test was performed at 250° C. for one hour. As a result, the spectral characteristics of the dyeing filter varied greatly (the peak transmission factor was 10% or more; the peak wavelength shift was 10 nm or more). In contrast, the spectral characteristics of the vaper deposition filter of the present embodiment was small (the peak transmission factor varied 5% or less; the peak wavelength shift was 5 nm or less).

(2) Light Resistance:

A light resistance test was performed by 500-hour irradiation of Xe lamp luminous energy. As a result, the spectral characteristics of the dyeing filter varied greatly (the peak trasmission factor was 10% or more; the peak wavelength shift was 10 nm or more). In contrast, the spectral characteristics of the vapor deposition filter of the present embodiment hardly varied.

What we claim is:

1. A method of making a photosensor by depositing a photoconductive layer under a plasma of glow discharge, said photosensor comprising said photoconductive layer formed on a substrate, said layer containing amorphous silicon, and a pair of electrodes provided on the same surface of said photoconductive layer, the spacing between said electrodes of said pair constituting at least a part of a photoreceptor, said method including the steps of first performing deposition with relatively large discharge power, and then continuing the deposition while decreasing the discharge power slowly, thereby forming the photoconductive layer, the refractive index of at least a portion of which varies continuously through the thickness of the layer.

* * * * *

UNITED STATES PATENT AND TRADEMARK OFFICE
CERTIFICATE OF CORRECTION

PATENT NO. : 4,746,535
DATED : May 24, 1988
INVENTOR(S) : MASAKI FUKAYA, ET AL.

It is certified that error appears in the above-identified patent and that said Letters Patent is hereby corrected as shown below:

COLUMN 1

Line 28, "is" should be deleted.

COLUMN 3

Line 18, "matrix section;" should read --matrix wiring section;--.
Lines 26-27, "removed; FIG. 15 is a cross-sectional view taken along" should read --removed;--.

COLUMN 4

Line 7, "numeral 3" should read --numeral 1--.

COLUMN 7

Line 46, "(porduced" should read --(produced--.

COLUMN 10

Line 32, "CONH" should read --COHN--.

COLUMN 15

Line 1, "skelton" should read --skeleton--.

COLUMN 16

Line 17, "dishcarge" should read --discharge--.

UNITED STATES PATENT AND TRADEMARK OFFICE
CERTIFICATE OF CORRECTION

PATENT NO. : 4,746,535
DATED : May 24, 1988
INVENTOR(S) : MASAKI FUKAYA, ET AL.

It is certified that error appears in the above-identified patent and that said Letters Patent is hereby corrected as shown below:

COLUMN 18

Line 29, "3A'" should read --3A--.
Line 36, "3'" should read --3A--.
Line 39, "embodiment of because" should read --the embodiment of FIG. 3 because--.

COLUMN 20

Line 57, "fine" should read --fin--.

COLUMN 21

Line 16, "conneted" should read --connected--.
Line 64, "discahrge" should read --discharge--.

COLUMN 22

Line 48, "form" should read --from--.

COLUMN 23

Line 25, "blocks" should read --block--.
Line 33, "discahrge" should read --discharge--.
Line 42, "embodiment 19." should read --embodiment 9.--.

COLUMN 24

Line 42, "haivng" should read --having--.
Line 51, "used a" should read --used as a--.

UNITED STATES PATENT AND TRADEMARK OFFICE
CERTIFICATE OF CORRECTION

PATENT NO. : 4,746,535
DATED : May 24, 1988
INVENTOR(S) : MASAKI FUKAYA, ET AL.

It is certified that error appears in the above-identified patent and that said Letters Patent is hereby corrected as shown below:

COLUMN 25

Line 66, "thickenss" should read --thickness--.

COLUMN 26

Line 10, "vaper" should read --vapor--.
Line 20, "layer" should read --layers--.
Line 23, "Then the" should read --The--.
Line 53, "CIBAGEIGY" should read --CIBA GEIGY--.

COLUMN 27

Line 11, "sound" should read --found--.

COLUMN 28

Line 2, "vaper" should read --vapor--.

Signed and Sealed this

Thirty-first Day of January, 1989

*Attest:*

DONALD J. QUIGG

*Attesting Officer*   *Commissioner of Patents and Trademarks*